(12) United States Patent
Fukshima et al.

(10) Patent No.: US 8,525,204 B2
(45) Date of Patent: Sep. 3, 2013

(54) SEMICONDUCTOR LIGHT EMITTING ELEMENT AND ILLUMINATING APPARATUS USING THE SAME

(75) Inventors: Hiroshi Fukshima, Kadoma (JP);
Kazuyuki Yamae, Ikoma (JP);
Masaharu Yasuda, Takarazuka (JP);
Tomoya Iwahashi, Ibaraki (JP);
Akihiko Murai, Yao (JP)

(73) Assignee: Panasonic Corporation, Osaka (JP)

( * ) Notice: Subject to any disclaimer, the term of this patent is extended or adjusted under 35 U.S.C. 154(b) by 246 days.

(21) Appl. No.: 12/933,749

(22) PCT Filed: Mar. 25, 2009

(86) PCT No.: PCT/JP2009/055904
§ 371 (c)(1),
(2), (4) Date: Sep. 21, 2010

(87) PCT Pub. No.: WO2009/119640
PCT Pub. Date: Oct. 1, 2009

(65) Prior Publication Data
US 2011/0018024 A1    Jan. 27, 2011

(30) Foreign Application Priority Data

Mar. 26, 2008  (JP) .................. 2008-081565
Mar. 23, 2009  (JP) .................. 2009-070332

(51) Int. Cl.
*H01L 33/00* (2010.01)
(52) U.S. Cl.
USPC ............... 257/98; 257/99; 438/22; 438/25; 438/26; 438/27; 438/29
(58) Field of Classification Search
USPC ............................................. 257/98
See application file for complete search history.

(56) References Cited

U.S. PATENT DOCUMENTS

2003/0213969 A1* 11/2003 Wang et al. .................... 257/98
2005/0012109 A1    1/2005 Kohno et al.
(Continued)

FOREIGN PATENT DOCUMENTS

JP    11-219919    8/1999
JP    2004-274042    9/2004
(Continued)

OTHER PUBLICATIONS

Jong Kyu Kim et al., "GaInN light-emitting diodes with $RuO_2/SiO_2/$Ag omni-directional reflector", Applied Physics Letters, May 31, 2004, vol. 84, No. 22, pp. 4508-4510.

(Continued)

*Primary Examiner* — Ajay K Arora
(74) *Attorney, Agent, or Firm* — Greenblum & Bernstein, P.L.C.

(57) ABSTRACT

A semiconductor light emitting element, including: an n-type semiconductor layer having optical transparency with an emission wavelength of a light emitting layer, the light emitting layer and a p-type semiconductor layer, which are laminated; and a reflection film which is disposed on a side opposite to a surface from which light emitted from the light emitting layer is extracted, wherein the reflection film comprises: a transparent layer having optical transparency with the emission wavelength of the light emitting layer, and a metal layer, which is laminated on the transparent layer on a side opposite to the light emitting layer and is constituted by a metal material having a high reflectance, the transparent layer has a refractive index lower than a refractive index of a layer disposed on a side of the light emitting layer when viewed from the transparent layer, with the emission wavelength, and a thickness of the transparent layer is equal to or more than a value obtained by dividing a value of ¾ of the emission wavelength by the refractive index of the transparent layer.

17 Claims, 20 Drawing Sheets

(56) References Cited

U.S. PATENT DOCUMENTS

| | | |
|---|---|---|
| 2005/0017262 A1 | 1/2005 | Shei et al. |
| 2005/0199891 A1 | 9/2005 | Kunisato et al. |
| 2005/0269588 A1 | 12/2005 | Kim et al. |
| 2008/0062565 A1 | 3/2008 | Umezaki et al. |
| 2009/0026468 A1 | 1/2009 | Sakai et al. |

FOREIGN PATENT DOCUMENTS

| | | |
|---|---|---|
| JP | 2004-297096 | 10/2004 |
| JP | 2005-72148 | 3/2005 |
| JP | 2005-259832 | 9/2005 |
| JP | 2005-347728 | 12/2005 |
| JP | 2006-128727 | 5/2006 |
| JP | 2007-067184 | 3/2007 |
| JP | 2008-016629 | 1/2008 |
| JP | 2008016629 A * | 1/2008 |
| JP | 2008-65878 | 3/2008 |
| WO | 2007/099855 | 9/2007 |

OTHER PUBLICATIONS

Extended European Search Report, dated Jun. 14, 2013.

* cited by examiner

DEPENDENCY OF WEIGHTED AVERAGE REFLECTANCE OF TRANSPARENT LAYER /Ag ELECTRODE ON TRANSPARENT LAYER FILM THICKNESS($\lambda$ =455nm)

REFLECTANCE, TRANSMITTANCE AND ABSORPTANCE
OF SILVER WITH $\lambda = 455$ nm

ENLARGED VIEW OF AREA OF WHICH FILM
THICKNESS IS 20 nm OR LESS IN FIG. 6

RADIANT FLUX ANGLE DISTRIBUTION
CONSIDERING SOLID ANGLE

REFLECTANCE OF REFLECTION LAYER
AND LIGHT EXTRACTION EFFICIENCY
(SIMULATION BY RAY TRACING METHOD)

WEIGHTED AVERAGE
REFLECTANCE
$\langle R \rangle = \int \int R(\theta, \phi) \sin\phi \, d\theta \, d\phi$

FIG. 22

| SAMPLE | LAYER STRUCTURE | DEGREE OF ADHESION EVALUATION (TENSILE STRENGTH) | EVALUATION RESULT |
|---|---|---|---|
| 1 | GaN(LED)/Ag | 10 N/mm² | NO GOOD SEPARATION GENERATED |
| 2 | GaN(LED)/Pt(0.1nm)/Ag | 44.0 N/mm² | GOOD NO SEPARATION |
| 3 | GaN(LED)/Pt(0.3nm)/Ag | 44.7N/mm² OR MORE | GOOD NO SEPARATION |
| 4 | GaN(LED)/Pt(1.0nm)/Ag | 44.7N/mm² OR MORE | GOOD NO SEPARATION |

* SAMPLES 3 AND 4 ARE MEASURED WITH A VALUE EXCEEDING THE MEASUREMENT LIMIT VALUE.

SEMICONDUCTOR LIGHT EMITTING ELEMENT AND ILLUMINATING APPARATUS USING THE SAME

TECHNICAL FIELD

The present invention relates to a semiconductor light emitting element which emits light by combining an electron and hole(s) combining in a semiconductor, and an illuminating apparatus using the semiconductor light emitting element, and more particularly to a method for improving light extraction efficiency of a semiconductor light emitting element which has an emission peak in the shorter wavelength side from red light.

BACKGROUND ART

In a semiconductor light emitting element in which an n-type semiconductor layer, a light emitting layer and a p-type semiconductor layer are laminated on a growth substrate having optical transparency with the emission wavelength of the light emitting layer, a method for forming a reflection film having high reflectance on the side opposite to the surface, from which the light emitted from the light emitting layer is extracted, has been used as a means of improving light extraction efficiency (or external quantum efficiency). This is because the light generated in the semiconductor light emitting layer has a nature to be emitted in all directions, and as FIG. 8 shows, more lights are emitted diagonally (the output angle is large) than lights emitted upward from the emission point (the output angle is small), so most of the lights emitted from the light emitting layer are lost after performing multiple reflection inside the element.

FIG. 9 shows a change of light extraction efficiency with respect to the change of the reflectance of the reflection film. As FIG. 9 shows, 95% or higher reflectance is required to increase the light extraction efficiency to be 70% or higher, and in this 95% or higher area, light extraction efficiency improves about 6% if the reflectance improves only 1%. In the case of a GaAs semiconductor, high reflectance is implemented, and light extraction efficiency can be improved by using Au as a material of an electrode, which also functions as the reflection film.

However the reflectance of a metal greatly depends on the wavelength, and this method cannot be used on oxide or nitride compound semiconductor light emitting elements which have an emission peak in the shorter wavelength side from red light. For example, ohmic contact cannot be guaranteed between a GaN material and a high reflection metal, such as silver and aluminum. Therefore a laminated electrode of such a metal as Ni, Pt or Rh, such a metal oxide as ITO (Indium Tin Oxide), and a high reflection metal, is used, which makes it difficult to obtain a reflectance higher than the natural reflectance of the high reflection metal.

In Non-patent Document 1, a prior art to solve this problem is proposed. In this prior art, an $SiO_2$ film with ¼ optical wavelength is layered between silver as the high reflection metal and a pGaN layer, which is a semiconductor layer, in order to guarantee a reflectance higher than the natural reflectance of the high reflection metal, and higher reflectance is obtained for all the incident angles compared with the case of silver film alone. By this, an ODR (Omni-Directional Reflector) is formed and the average reflectance becomes 98% when calculated with a 450 nm wavelength. The ohmic contact is guaranteed by means of micro-contacts in which $RuO_2$ (ruthenium oxide) film is formed between the above mentioned pGaN layer and the $SiO_2$ film, and the silver layer is electrically connected with the pGaN layer via the $RuO_2$ film through the openings formed in the $SiO_2$ film.

This prior art is supposed to implement high reflectance for all the incident angles, but as a result of the present inventors performing similar calculations, it was found out, as shown in FIG. 10, that the reflectance drops about 20% in a wide angle range centered around 55° if the film thickness of $SiO_2$ film has a ⅛ optical wavelength film thickness (0.5Q), and the reflectance drops about 30% in an angle range centered around 45° if the $SiO_2$ film thickness has ¼ optical wavelength film thickness (1Q). The probable reason is that if a single layer of $SiO_2$ film is formed on metal as a reflection film, good reflection can be obtained at a ¼ optical wavelength film thickness (1Q) when the incident angle is small, but as the incident angle increases, light which effuses from the semiconductor layer to the $SiO_2$ film as shown by the broken line in FIG. 11, in other words, light called "near field wave" or "evanescent wave" couples with the silver film layer. In FIG. 10, ¼ optical wavelength film thickness=$\lambda/(4n)$=1Q, n is a refractive index. In FIG. 10, in order to obtain the data characteristics written in Non-patent Document 1, that is 98% reflectance, using an average value of each reflectance at 0 to 90° incident angle, the thickness of the reflection film must be increased to 5Q or 6Q.

As FIG. 12 shows, the above mentioned effusing amount is zero until the incident angle $\theta$ is critical angle $\theta c$, and light effuses up to the depth of about wavelength $\lambda$ at critical angle $\theta c$, then it exponentially decreases. $\theta c$=30° to 40°. Non-patent Document 1: GaInN light-emitting diodes with $RuO_2$, $OSiO_2$, OAg omni-directional reflector (Jong Kyu Kim, Thomas Gesmann, Hong Luo and E. Fred Schubert, Applied Physics Letters, 84, 4508 (2004), Rensselaer Polytechnic Institute)

DISCLOSURE OF THE INVENTION

It is an object of the present invention to provide a semiconductor light emitting element which can improve the light extraction efficiency, and an illuminating apparatus using this element.

A semiconductor light emitting element or an illuminating apparatus according to an aspect of the present invention has an n-type semiconductor layer having optical transparency with an emission wavelength of a light emitting layer; the light emitting layer; and a p-type semiconductor layer, which are laminated; and a reflection film which is disposed on a side opposite to a surface from which light emitted from the light emitting layer is extracted, wherein the reflection film comprises: a transparent layer having optical transparency with the emission wavelength of the light emitting layer; and a metal layer, which is laminated on a side opposite to the light emitting layer and is constituted by a metal material having a high reflectance, and the transparent layer has a refractive index lower than the refractive index of a layer disposed on a side of the light emitting layer when viewed from the transparent layer, with the emission wavelength, and a thickness of the transparent layer is equal to or more than a value obtained by dividing a value of ¾ of the emission wavelength by the refractive index of the transparent layer.

According to this configuration, in a semiconductor light emitting element in which at least an n-type semiconductor layer, a light emitting layer and a p-type semiconductor layer are laminated in this order, or in a reverse order on a substrate which has optical transparency with the emission wavelength of the light emitting layer, and has a conductive buffer layer on a conductive substrate or insulating substrate, so as to be conductive, or on a growth substrate such as an insulating substrate which is separated after the semiconductor layer is grown, a reflection film is disposed on the side opposite to the surface from which light, emitted from the light emitting layer, is extracted. The reflection film is comprised of a transparent layer that has a refractive index lower than the refractive index of the layer disposed at the light emitting layer side with the emission wavelength of the light emitting layer, and has a thickness which is equal to or more than a value obtained by dividing a value of ¾ of the emission wavelength by the refractive index of the transparent layer, and a metal layer which is laminated on the transparent layer, and is constituted by a metal material having a high reflectance.

Therefore the light which entered at a relatively small angle (small incident angle) less than the critical angle θc is reflected by the transparent layer or the metal layer. The light which entered at a relatively large angle (large incident angle) exceeding the critical angle θc becomes the effusing light, called the "near field wave" or the "evanescent wave", which effuses from the interface between the growth substrate constituted by GaN having high refractive index, or the semiconductor layer, and the reflection film to the transparent layer at the interface. However if the transparent layer has a thickness obtained by dividing a value of ¾ of the emission wavelength by the refractive index of the transparent layer, the possibility of the light passing through the transparent layer and being absorbed by the metal layer decreases, and most of the lights return from the transparent layer to the interface (reflected), and reenter the growth substrate or the semiconductor layer via the interface, and propagate toward the light extraction surface.

Therefore lights which entered the reflection film at all kinds of incident angles can be extracted efficiently, and less power consumption is needed to extract the same amount of light, and brightness can be increased with supplying the same amount of power.

BRIEF DESCRIPTION OF THE DRAWINGS

FIG. 19 are plan views depicting an example of the transparent layer shown in FIG. 1 or FIG. 2, where

FIG. 20 are plan views depicting another example of the transparent layer shown in FIG. 1 or FIG. 2, where

FIG. 22 is a table showing the experiment result of examining the relationship of the thickness of the Pt layer and the degree of adhesion (tensile strength).

BEST MODE FOR CARRYING OUT THE INVENTION

Figure 1:
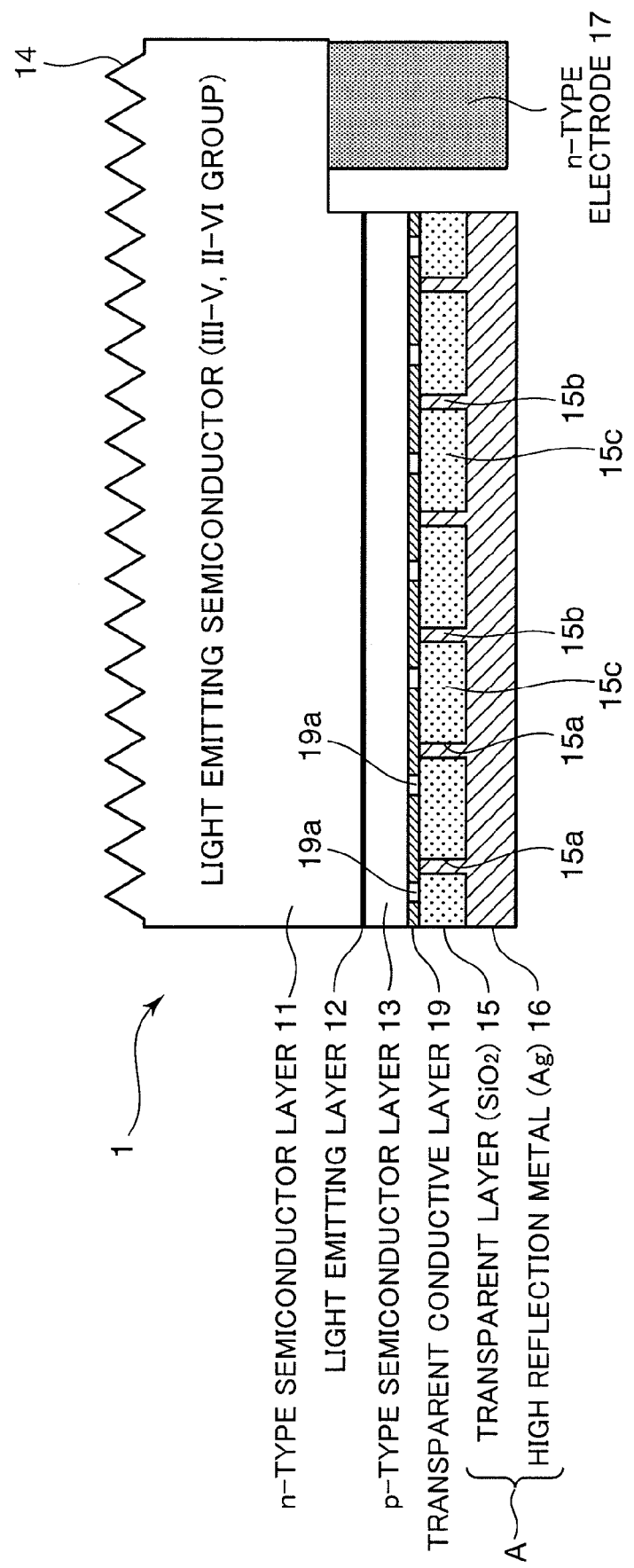
FIG. 1 is a cross-sectional view depicting the structure of a light emitting diode, which is a semiconductor light emitting element according to an embodiment of the present invention.
Figure 2:
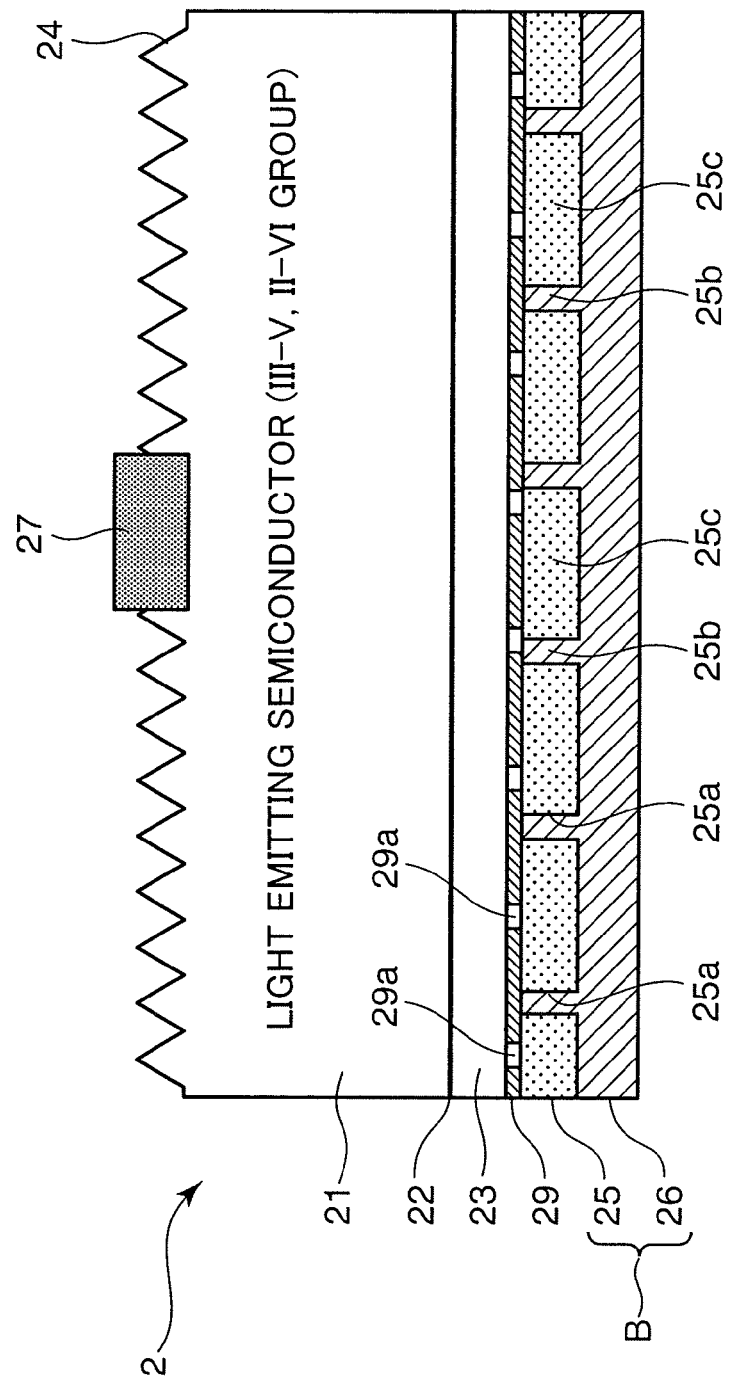
FIG. 2 is a cross-sectional view depicting the structure of a light emitting diode, which is a semiconductor light emitting element according to an embodiment of the present invention.
Figure 3:
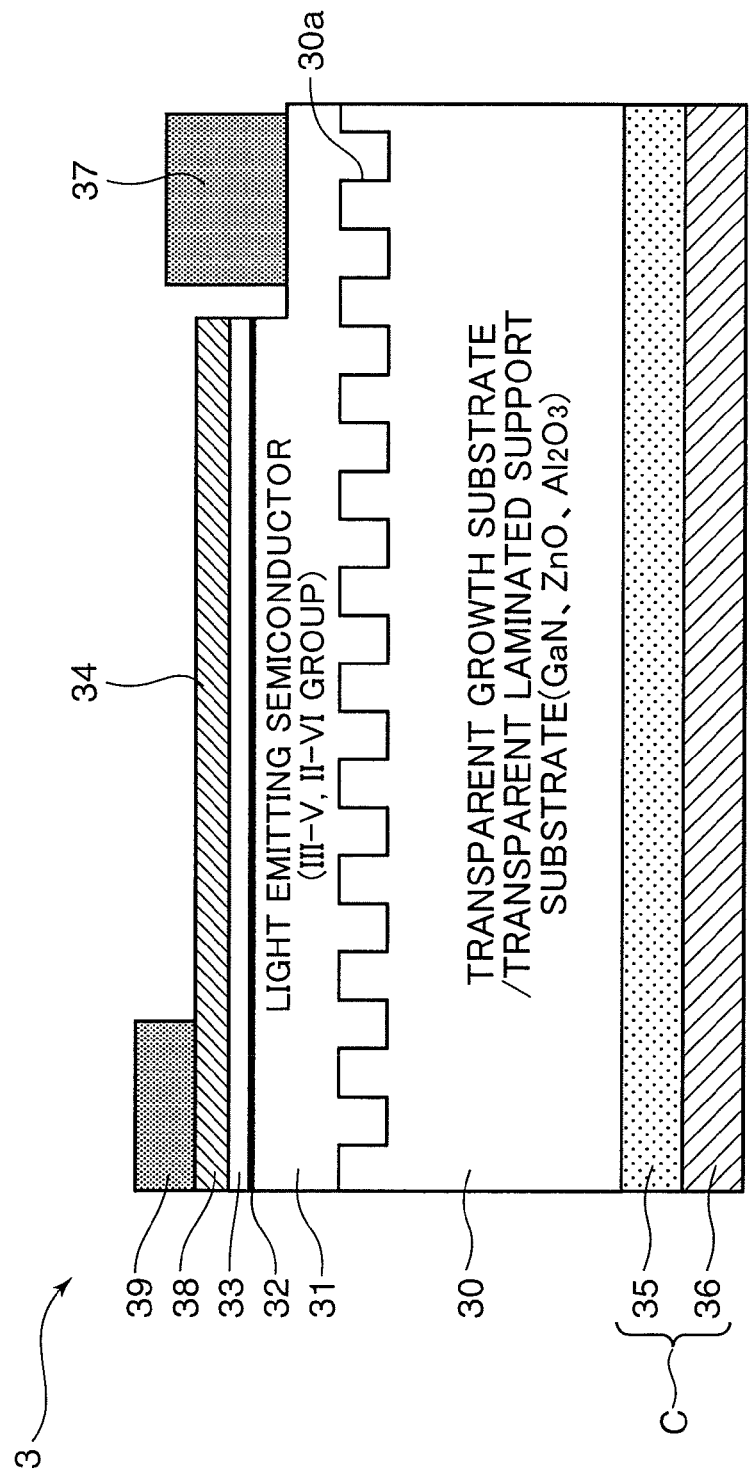
FIG. 3 is a cross-sectional view depicting the structure of a light emitting diode, which is a semiconductor light emitting element according to an embodiment of the present invention.
Figure 4:
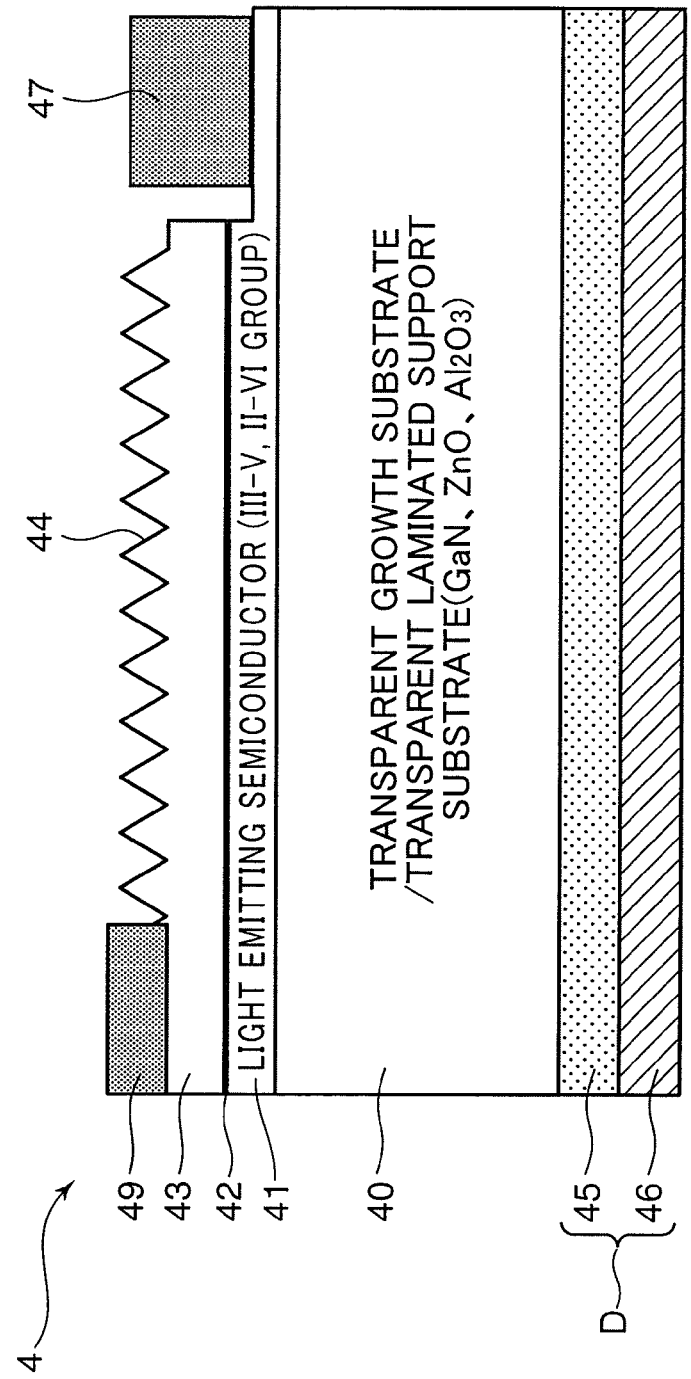
FIG. 4 a cross-sectional view depicting the structure of a light emitting diode, which is a semiconductor light emitting element according to an embodiment of the present invention.

FIG. 1 to FIG. 4 are cross-sectional views depicting configurations of the light emitting diodes 1 to 4, which are semiconductor light emitting elements according to an embodiment of the present invention. The configurations in FIG. 1 to FIG. 4 are typical configuration examples of the semiconductor light emitting elements to which the present invention is applied, and the light emitting diode 1 in FIG. 1 is a flip-chip type, and the light emitting diodes 2 to 4 in FIG. 2 to FIG. 4 are wire bonding types.

The light emitting diode 1 in FIG. 1 has an n-type semiconductor layer 11, a light emitting layer 12 and a p-type semiconductor layer 13, which are laminated, and has a reflection film which is disposed on the side opposite to a light extracting surface 14 from which light emitted from the light emitting layer 12 is extracted. Noteworthy here is that the p-type electrode is the reflection film A according to the present invention. The reflection film A has: a transparent layer 15 which has a refractive index lower than the refractive index of the p-type semiconductor layer 13 to which this reflection film contacts, and a thickness equal to or greater than the ¾ optical wavelength (3Q) in an emission wavelength of the light emitting layer 12; and a metal layer 16 which is laminated on the transparent layer 15, and is made of a metal material having a high reflectance.

As mentioned later, metal portions 15b, which are in the form of a mesh or a plurality of islands through the transparent layer 15 to electrically connect the p-type semiconductor layer 13 and the metal layer 16 are disposed in a part of the transparent layer 15. As FIG. 1 shows, a transparent conductive layer 19 (first electrode layer) may be laminated between the p-type semiconductor layer 13 and the transparent layer 15.

Each of the above layers 11 to 13 is made of the III-V group semiconductor or the II-VI group semiconductor, and in the case of GaN, for example, has a wavelength λ of about 455 nm and a refractive index of about 2.5. The transparent layer 15 is made of $SiO_2$, for example, and has a refractive index of about 1.43. The metal layer 16 is made of silver, for example. After the layers are formed up to the metal layer 16, one corner thereof is removed, and the n-type electrode 17 connected to the n-type semiconductor layer 11 is formed. Further, after the growth substrate is stripped, the stripped surface is roughened to form the light extracting surface 14. The configuration shown in FIG. 1 is completed.

In the light emitting diode 2 in FIG. 2 as well, an n-type semiconductor layer 21, a light emitting layer 22 and a p-type semiconductor layer 23 are laminated on a growth substrate, which is not illustrated, and a reflection film is disposed on the surface opposite to a light extracting surface 24 for light emitted from the light emitting layer 22. Noteworthy here is that the p-type electrode is the reflection film B according to the present invention. The reflection film B is comprised of a transparent layer 25 having a refractive index lower than the refractive index of the p-type semiconductor layer 23 to which this reflection film B contacts, and a thickness equal to or greater than ¾ optical wavelength (3Q) in an emission wavelength of the light emitting layer 22, and a metal layer 26 which is laminated on the transparent layer 25 and is made of a metal material having a high reflectance. Each of the layers 21 to 23 is made of a III-V group semiconductor or a II-VI group semiconductor, such as GaN, and the transparent layer 25 is made of $SiO_2$, for example, and the metal layer 26 is made of silver, for example. After the layers are formed up to the metal layer 26, the growth substrate is stripped, the stripped surface is roughened to form the light extracting surface 24, and an n-type electrode 27 is formed on the roughened surface. Accordingly, the metal layer 26 serves as the p-type contact. The configuration shown in FIG. 2 is completed.

As mentioned later, metal portions 25b, which are in the form of a mesh or a plurality of islands through the transparent layer 25 to electrically connect the p-type semiconductor layer 23 and the metal layer 26, are disposed in a part of the transparent layer 25. As FIG. 2 shows, the transparent conductive layer 29 (first electrode layer) may be laminated between the p-type semiconductor layer 23 and the transparent layer 25.

In the light emitting diode 3 in FIG. 3, on the other hand, an interface 30a is roughened, and an n-type semiconductor layer 31, a light emitting layer 32 and a p-type semiconductor layer 33 are laminated on a growth substrate (or laminated substrate) 30 which is transparent in the emission wavelength of the light emitting layer 32, and a reflection film is disposed on a surface opposite to a light extracting surface 34 for light emitted from the light emitting layer 32. Noteworthy here is that the rear face of the growth substrate 30 bears the reflection film C according to the present invention. The reflection film C is comprised of a transparent layer 35 which has a refractive index lower than the refractive index of the growth substrate 30 to which this reflection film contacts, and a thickness equal to or greater than ¾ optical wavelength (3Q) in the emission wavelength of the light emitting layer 32, and a metal layer 36 which is laminated on the transparent layer 35 and is made of a metal material having a high reflectance. The growth substrate 30 is made of GaN, ZnO and $Al_2O_3$. Each of the layers 31 to 33 is made of a III-V group semiconductor or II-VI group semiconductor, and in the case of GaN, for example, has a wavelength λ of about 455 nm, and a refractive index of about 2.5. The transparent layer 35 is made of $SiO_2$, for example, and has a refractive index of about 1.43. The metal layer 36 is made of silver, for example. After a transparent conductive layer 38 is formed on the p-type semiconductor layer 33, and the transparent layer 35 and the metal layer 36 are formed on the rear face side, and an n-type electrode 37 and a p-type electrode 39 are formed on a removed corner portion and the transparent conductive layer 38. Thus, the configuration shown in FIG. 3 is completed. The n-type semiconductor layer 31 and the p-type semiconductor layer 33 may be replaced. In this case, the electrode 37 serves as the p-type and the electrode 39 serves as the n-type.

In the light emitting diode 4 in FIG. 4, an n-type semiconductor layer 41, a light emitting layer 42 and a p-type semiconductor layer 43 are laminated on a transparent growth substrate (or laminated substrate) 40 transparent in the emission wavelength of the light emitting layer 42, and a reflection film is disposed on a face side opposite to a light extracting surface 44 for light emitted from the light emitting layer 42. The rear face side of the growth substrate 40 bears a reflection film D having a transparent layer 45 and a metal layer 46, similar to the above mentioned transparent layer 35 and the metal layer 36. The difference from FIG. 3 is that the top of the p-type semiconductor layer 43 which serves as the light extraction surface 44 is roughened. In the light emitting diode 4 as well, the n-type semiconductor layer 41 and the p-type semiconductor layer 43 may be replaced, and the n-type electrode 47 and the p-type electrode 49 may be the p-type and the n-type respectively.

Figure 8:
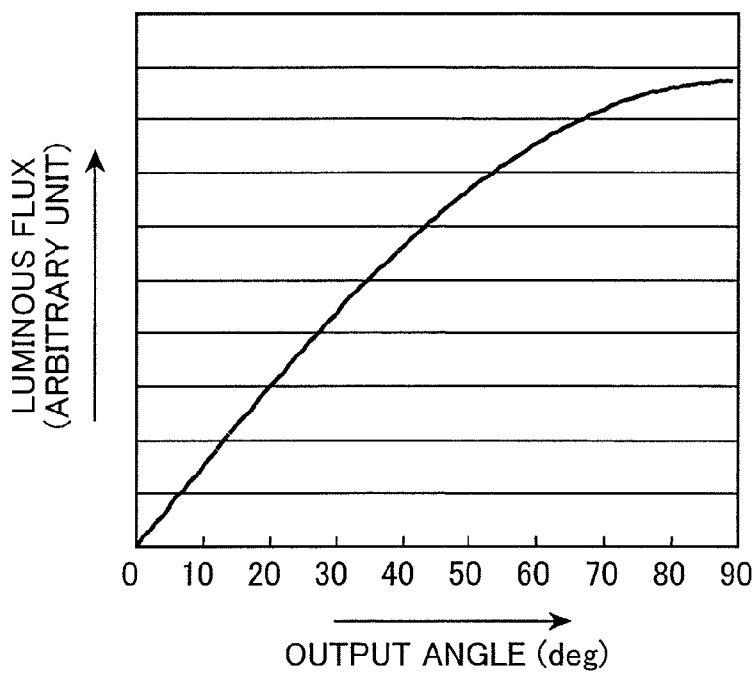
FIG. 8 is a graph depicting the change of luminous flux with respect to each output direction from the light emitting layer.
Figure 9:
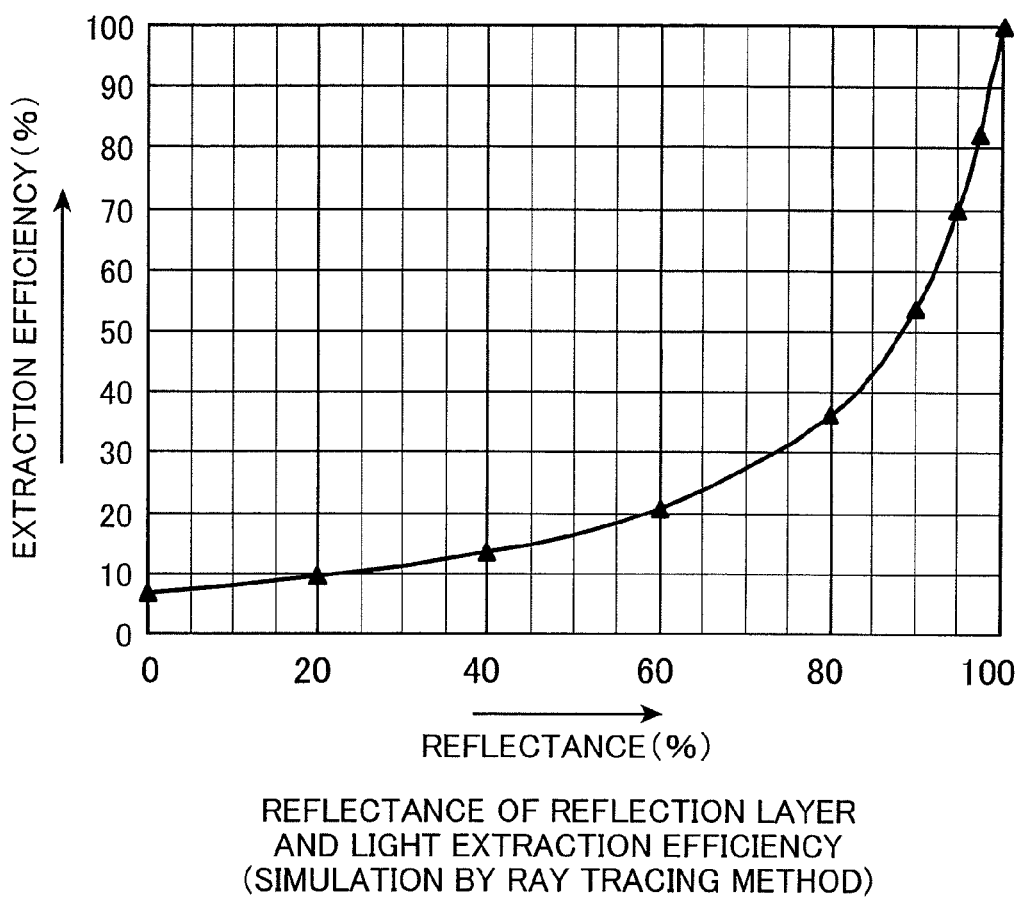
FIG. 9 is a graph depicting the change of the light extraction efficiency with respect to the change of reflectance of the reflection film.
Figure 10:
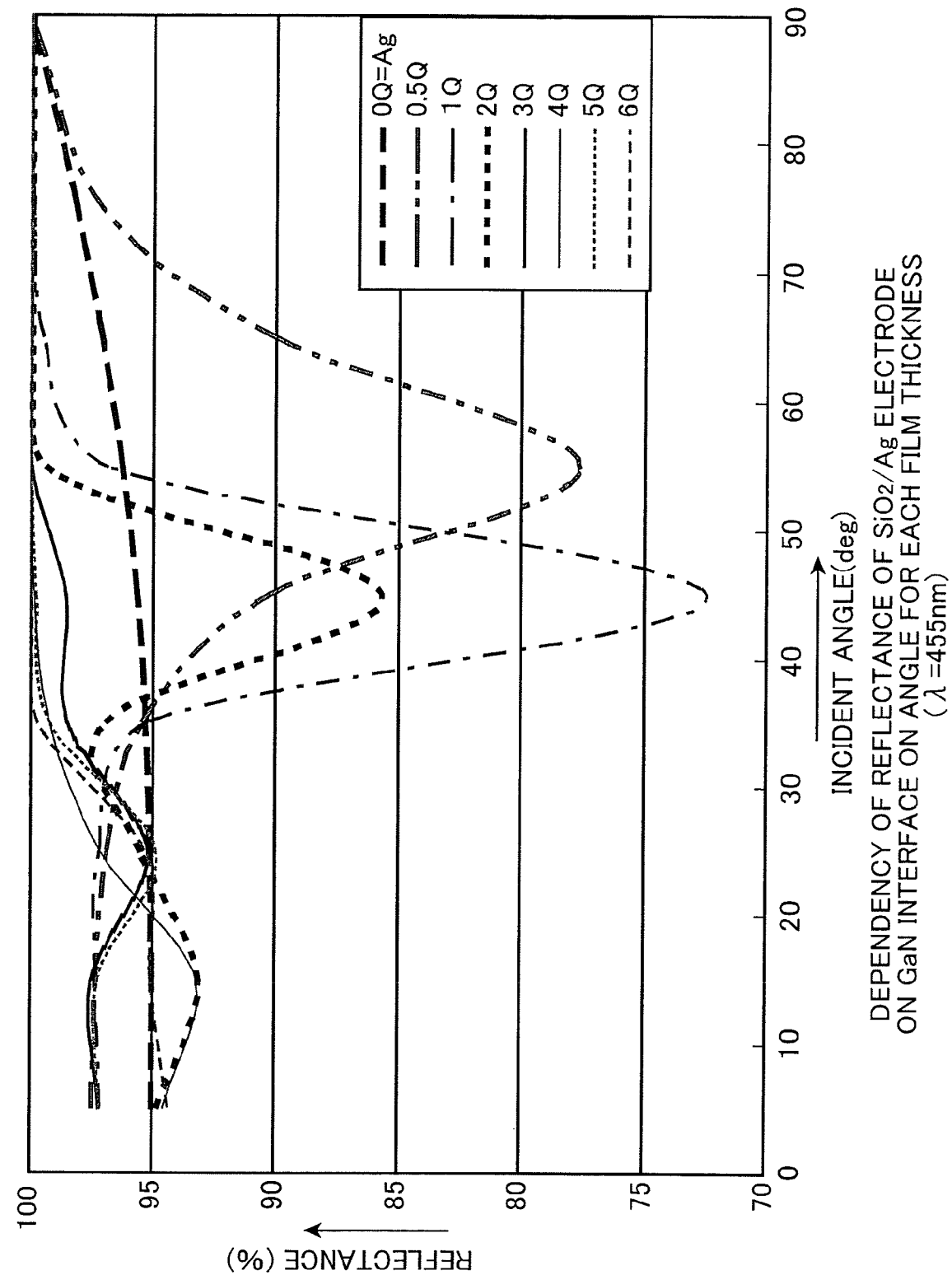
FIG. 10 is a graph depicting the actual change of reflectance with respect to the change of incident angle of the light to the reflection film according to a prior art.

In this way, according to the present embodiment, the reflectance is improved not by utilizing the ¼ optical wavelength thin film interference as in the case of the above mentioned Non-patent Document 1, but by utilizing the total reflection effect when the light enters from a medium having a high refractive index (e.g. GaN material: refractive index=2.5) to a medium having a low refractive index (e.g. $SiO_2$: refractive index=about 1.43). As the reflection film, the reflection layer is formed by the transparent layer 15, 25, 35 or 45 having a thickness equal to or greater than the ¾ optical wavelength film thickness, and the metal layer 16, 26, 36 or 46 made of silver, silver alloy, Al or Al alloy and laminated on the transparent layer. The rough structure for making the mirror reflection angles irregular is formed in the light extracting surface 14, 24 or 44, or the interface 30a. Thereby a higher average reflectance can be seen to be obtained from the view of the actual radiation angle distribution of light from the light emitting layer 12, 22, 32 or 42 shown in FIG. 8, although it is difficult in the range of small incident angle θ to accomplish improvement of the reflectance to exceed those in the case of being laminated with laminating the ¼ optical wavelength film according to Non-patent Document 1.

In concrete terms, in the interface between the growth substrate 30 or 40, or the semiconductor layer 13 or 23 having a high refractive index and the reflection film, the light having a relatively large incident angle exceeding the critical angle θc is likely to diffuse from the interface to the transparent layer 15, 25, 35 or 45, as the so-called "near field waves" or "evanescent waves". However, since the transparent layer 15, 25, 35 or 45 has a thickness equal to or greater than the ¾ optical wavelength, there is little possibility that the light passes through the transparent layer 15, 25, 35 or 45 and is then absorbed by the metal layer 16, 26, 36 or 46, but there is high possibility that the light returns from the transparent layer 15, 25, 35 or 45 to the interface (i.e., reflected), and enter the growth substrate 30 or 40 or the semiconductor layer 13 or 23 again from the interface, and propagate to the light extracting surface 14, 24, 34 or 44.

The light which has not been extracted by one transmission and reflected back to the inside in this way has a statistical distribution similar to the initial emission, because the angle transforming function is performed depending on the incident angle, refractive index and shape at the roughened surface of the light extracting surface 14, 24 or 44 or the interface 30a. Therefore, from the view of the weighted average reflectance for all the incident angles that is obtained based on the radiation angle distribution, higher reflectance can be seen to be obtained compared with the case of laminating the ¼ optical wavelength film according to Non-patent Document 1. In this way, light which has entered the reflection film at any incident angle can be extracted efficiently, and less power consumption is needed to extract the same amount of light, and brightness can be increased by supplying the same amount of power. In this film configuration, precise film thickness control is unnecessary and a lower number of film layers are required, thereby making the processing easier.

In FIG. 1 to FIG. 4, the minutely roughened structures are exemplary shown as a configuration of making the mirror reflection angle to be disturbed, however, the present invention is not limited to this structure. The purpose should be noted to eliminate the multiple reflection of repeating the mirror reflection in a rectangular parallelepiped. A slope may be created on the side face of the element by changing the macro structure of the element, or the element itself may have a truncated pyramid shape.

Figure 5:
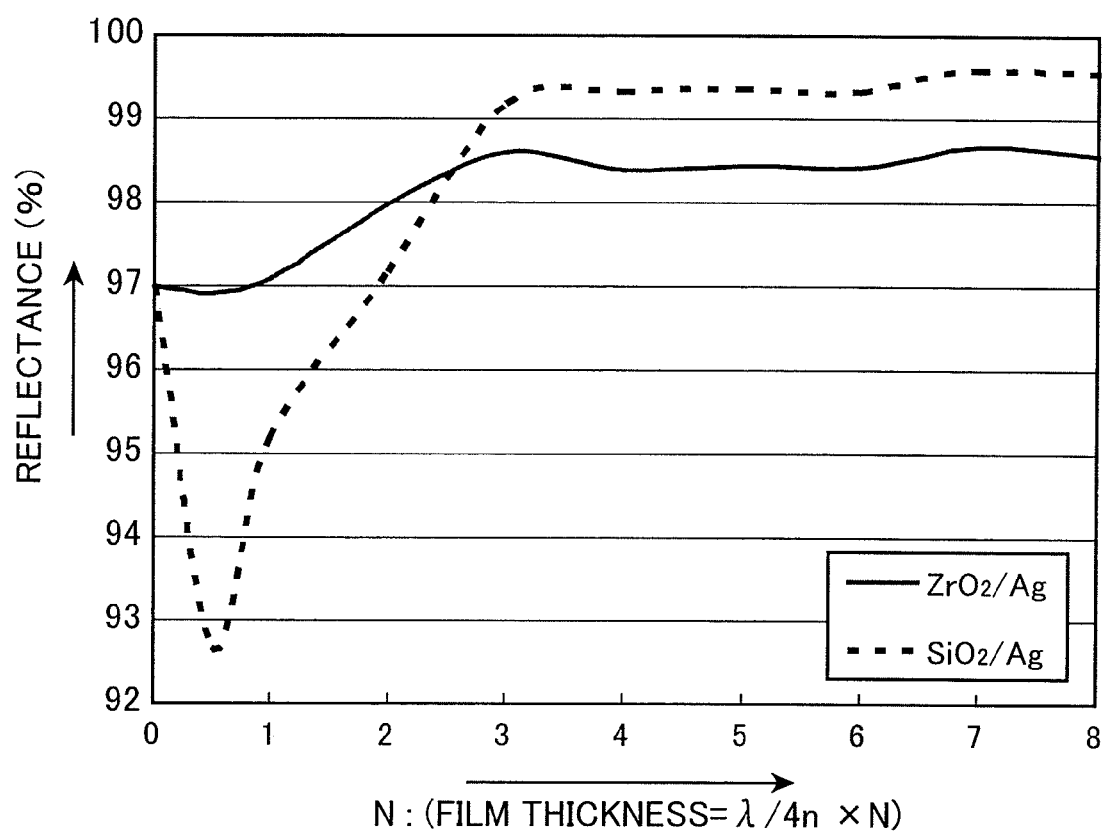
FIG. 5 is a graph depicting a change of reflectance with respect to the thickness of the change of the transparent layer when silver is used for the metal layer in the metal layer and transparent layer constituting the reflection film in each of the light emitting diodes.
Figure 11:
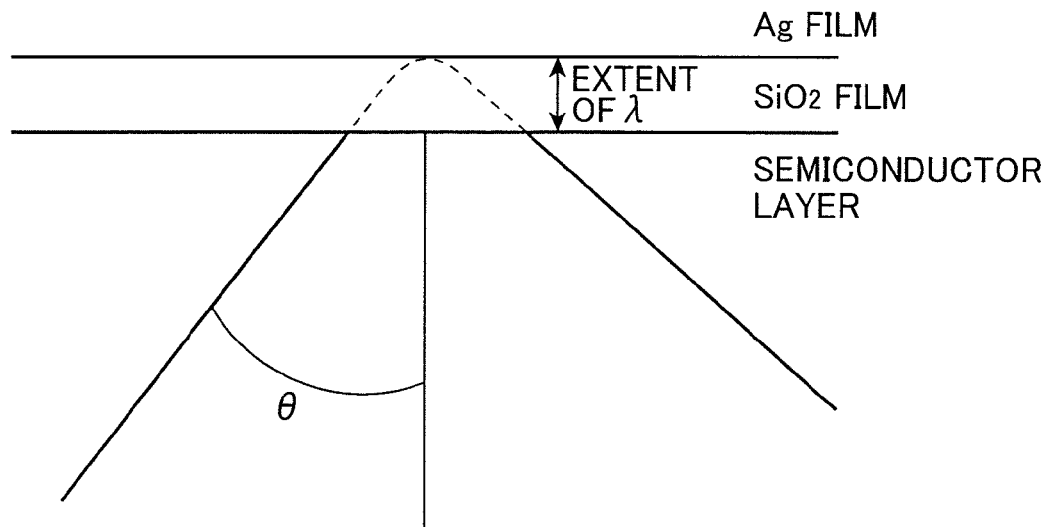
FIG. 11 is a diagram depicting an evanescent wave (near field wave).
Figure 12:
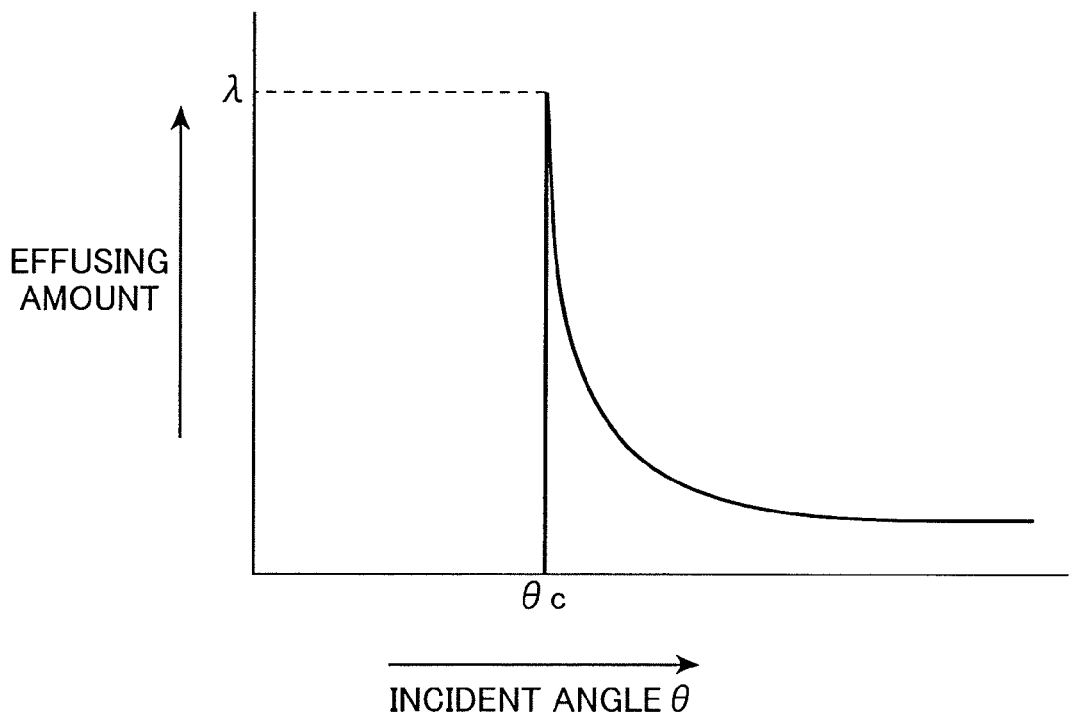
FIG. 12 is a graph depicting the change of the light effusing amount due to the evanescent wave with respect to the incident angle.

FIG. 5 shows the change of reflectance with respect to the change of thickness of the transparent layer 15, 25, 35 or 45, when silver is used for the metal layer 16, 26, 36 or 46. The abscissa denotes a film thickness N, and this film thickness N is indicated by a multiple n of the ¼ optical wavelength (1Q). As the above mentioned FIG. 11 and FIG. 12 show, the film thickness of the transparent layer 15, 25, 35 or 45, which utilizes the total reflection effect, must be one optical wavelength or more. FIG. 5 shows the above mentioned weighted average reflectance considering the radiant flux distribution shown in FIG. 8. Accordingly, it will be seen from FIG. 5 that the transparent layer 15, 25, 35 or 45 is enough to have a thickness of ¾ optical wavelength or more because having a reflectance of 99% or more.

The transparent layer 15 or 25 (later mentioned transparent portion 15c or 25c) and the transparent layer 35 or 45 are not limited to the above mentioned $SiO_2$, but may be $ZrO_2$ or may be $Al_2O_3$ or the like, having a refractive index between the refractive indexes 1.43 and 1.95 of $SiO_2$ and $ZrO_2$ respectively. If the light emitting semiconductor element is made of II-VI group ZnO material, however, $SiO_2$ is preferable for the transparent layer 15, 25, 35 or 45 to utilize the total reflection effect, since the refractive index of ZnO is about 2.0 (the refractive index difference is small and the total reflection effect is weak if $Al_2O_3$ or $ZrO_2$ is used). In FIG. 5, the reflectance characteristic of $ZrO_2$ is also shown.

For the transparent layer 15 or 25 (later mentioned transparent portions 15c or 25c) and the transparent layer 35 or 45, $SiO_2$, $ZrO_2$, $Al_2O_3$, $TiO_2$, $Ta_2O_5$, MgF, CaF or $Si_3N_4$, for example, can be used. These transparent layers or transparent portions may be constructed as a multilayer structure, in which a plurality of layers are laminated. Each layer laminated in this way may be made of a material selected from the above mentioned materials, or layers made of different materials may be laminated.

The total reflection effect can be obtained only if the thickness of the transparent layer 15, 25, 35 or 45 is the ¾ optical wavelength or more, as mentioned above. However the film actually deposited has film stress, and this film stress increases as the thickness of the film increases, and the films separate during processing or during use of the element, although this depends on the film deposition method. Therefore if the thickness of the transparent layer 15, 25, 35 or 45 is 5/4 optical wavelength or less, both the optical characteristic and the film stability can be implemented. When the transparent layer 15, 25, 35 or 45 is laminated, the film stress can be easily weakened by using sputtering, but the semiconductor layer is damaged in some cases, therefore if EB (Electron Beam) deposition, which causes less damage is used instead, the film stress can be easily increased, as mentioned above.

Figure 13:
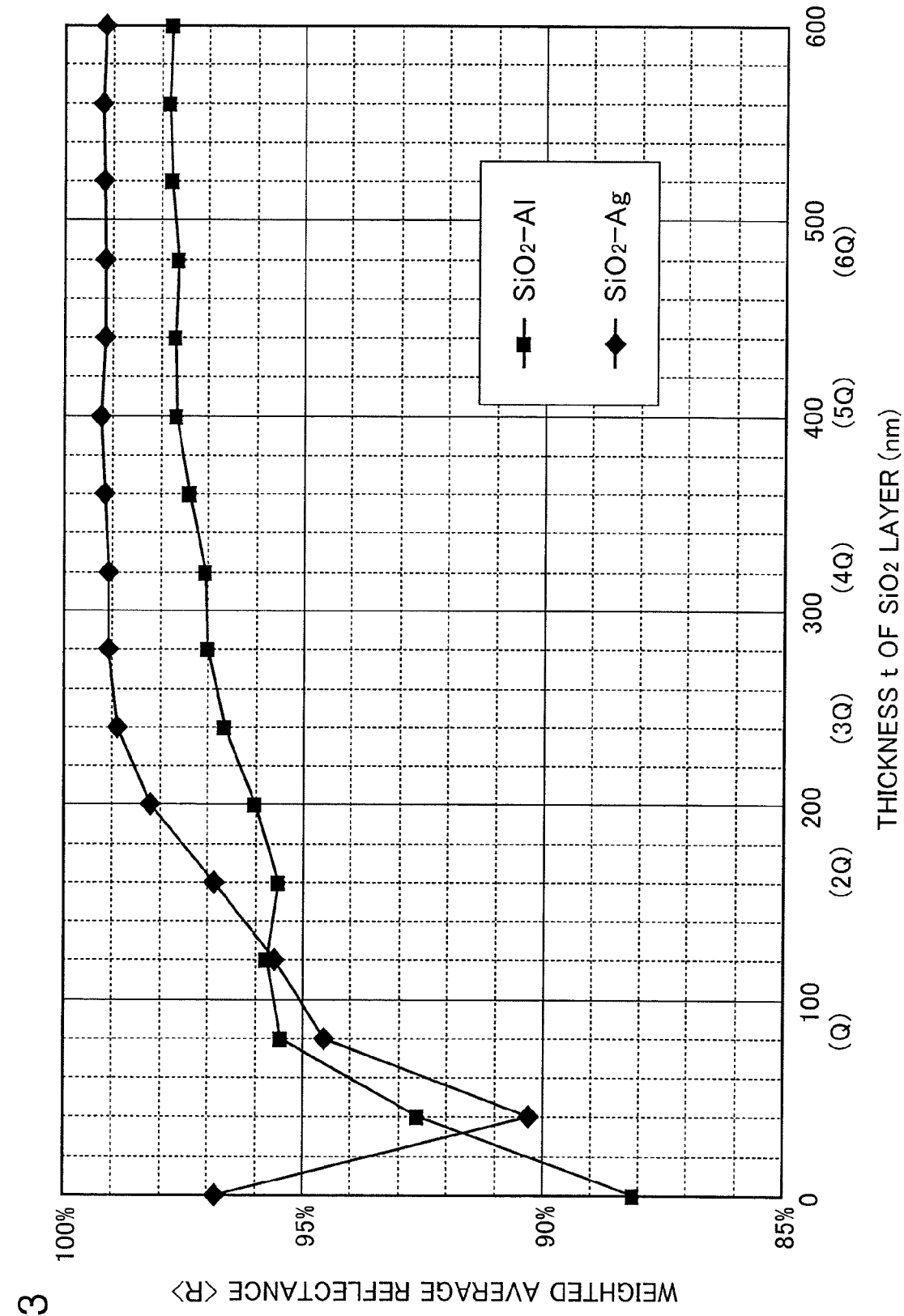
FIG. 13 is a graph depicting the relationship of the thickness of the transparent layer ($SiO_2$) and the reflectance of the reflection film.
Figure 14A:
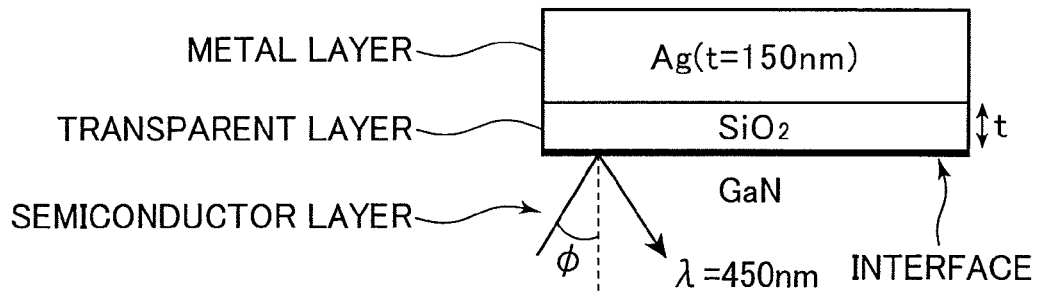
FIG. 14 are diagrams depicting the calculation conditions and the calculation method for the graph shown in FIG. 13.
Figure 14B:
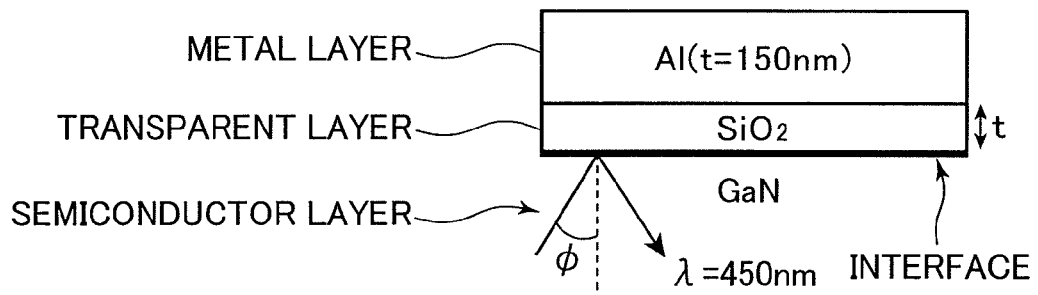
Figure 14C:
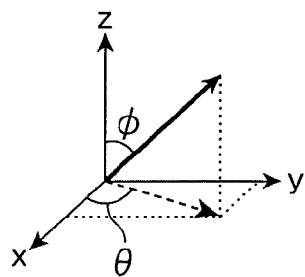

FIG. 13 is a graph depicting the relationship of the thickness of the transparent layer 15, 25, 35 or 45 ($SiO_2$), and the reflectance of the reflection film A, B, C or D. In FIG. 13, the weighted average reflectance <R> in the ordinate is a reflectance considering the solid angle distribution. FIG. 14A and FIG. 14B are diagrams depicting the conditions to calculate the weighted average reflectance <R> in FIG. 13. FIG. 14C is a diagram depicting the method for calculating the weighted average reflectance <R> considering the solid angle distribution.

In FIG. 14A and FIG. 14B, the refractive index n of the transparent layer ($SiO_2$) is 1.43, the reflective index n of the semiconductor layer (GaN) is 2.4, and the wavelength λ of the light is 450 nm. Then in FIG. 13, the optical wavelength film thickness Q becomes Q=450/(4×1.43)=78.7 nm. The weighted average reflectance <R> is a reflectance of the interface of the transparent layer ($SiO_2$).

In FIG. 14C, the term of sin ϕ, in the right hand side of expression of the weighted average reflectance <R>, is multiplied and convolution-integrated, whereby weighting according to the incident angle of the light is performed.

According to FIG. 13, if the thickness t of the transparent layer ($SiO_2$) is 3Q (a value obtained by dividing a value of ¾ of the emission wavelength by the refractive index of the transparent layer) or more, the weighted average reflectance <R> becomes 96% or more, and the weighted average reflectance <R> no longer increases even if the thickness t increases more, for both cases of using Ag for the metal or using Al for the metal layer. Therefore it is preferable that the thickness t of the transparent layer 15, 25, 35 or 45 is 3Q or more.

If the thickness t of the transparent layer ($SiO_2$) is 5Q (a value obtained by dividing a value of 5/4 of the emission wavelength by the refractive index of the transparent layer) or more, the weighted average reflectance <R> becomes approximately constant, so the reflectance improvement effect can no longer be implemented even if the thickness t is increased. Therefore it is preferable that the thickness t of the transparent layer 15, 25, 35 or 45 is 3Q to 5Q.

If the metal layer 16, 26, 36 or 46 is made of silver or a silver alloy, and is laminated with the transparent layer 15, 25, 35 or 45, the reflectance average 98% to 99% or more can be obtained, as shown in FIG. 5, and high light extraction efficiency can be implemented. The high reflection metal, however, is not limited to silver material, but Al is desirable for the light emitting element in the ultraviolet region. In the case of laminating the transparent layer 15, 25, 35 or 45 on Al as well, the average reflectance can be higher than the reflectance of Al alone, since the radiant flux is small in the incident angle area in which the reflectance of Al contributes, and the total reflection effect contributes in the area where the incident angle is large.

Figure 6:
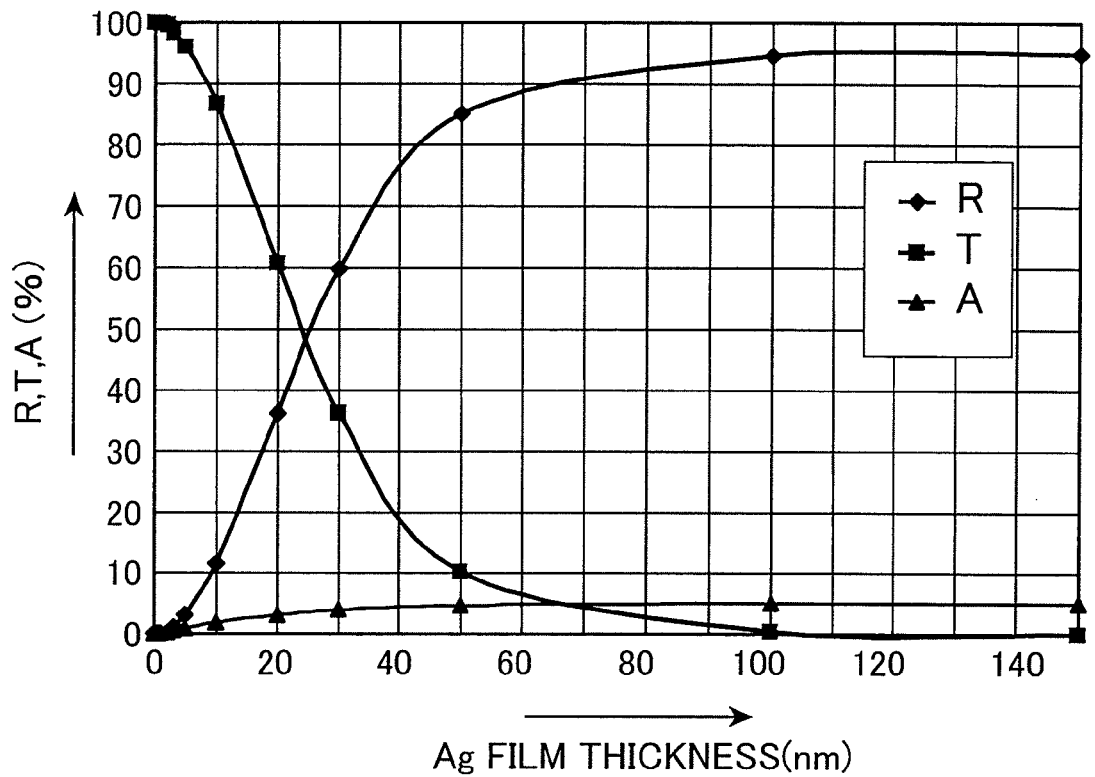
FIG. 6 is a graph depicting the changes of reflectance (R), transmittance (T) and absorptance (A) with respect to the change of film thickness of the silver reflection film.

FIG. 6 shows the film thickness and reflectance (R), transmittance (T) and absorptance (A) when the refractive index (n, k) of silver is (0.066, 2.5), although the values change depending on the film deposition method and film deposition conditions. Therefore in order to implement high reflectance, it is preferable that the film thickness is 80 nm or more, with which 90% or higher reflectance can be obtained. However it is preferable that the film thickness is 200 nm or less, since separation due to film stress easily occurs if the film thickness increases. It is especially preferable that the film thickness is about 100 nm in terms of implementing both reflectance and film stability.

For the metal layer 16, 26, 36 or 46, Al or an Al alloy, for example, can be used instead of silver or silver alloy.

Figure 15:
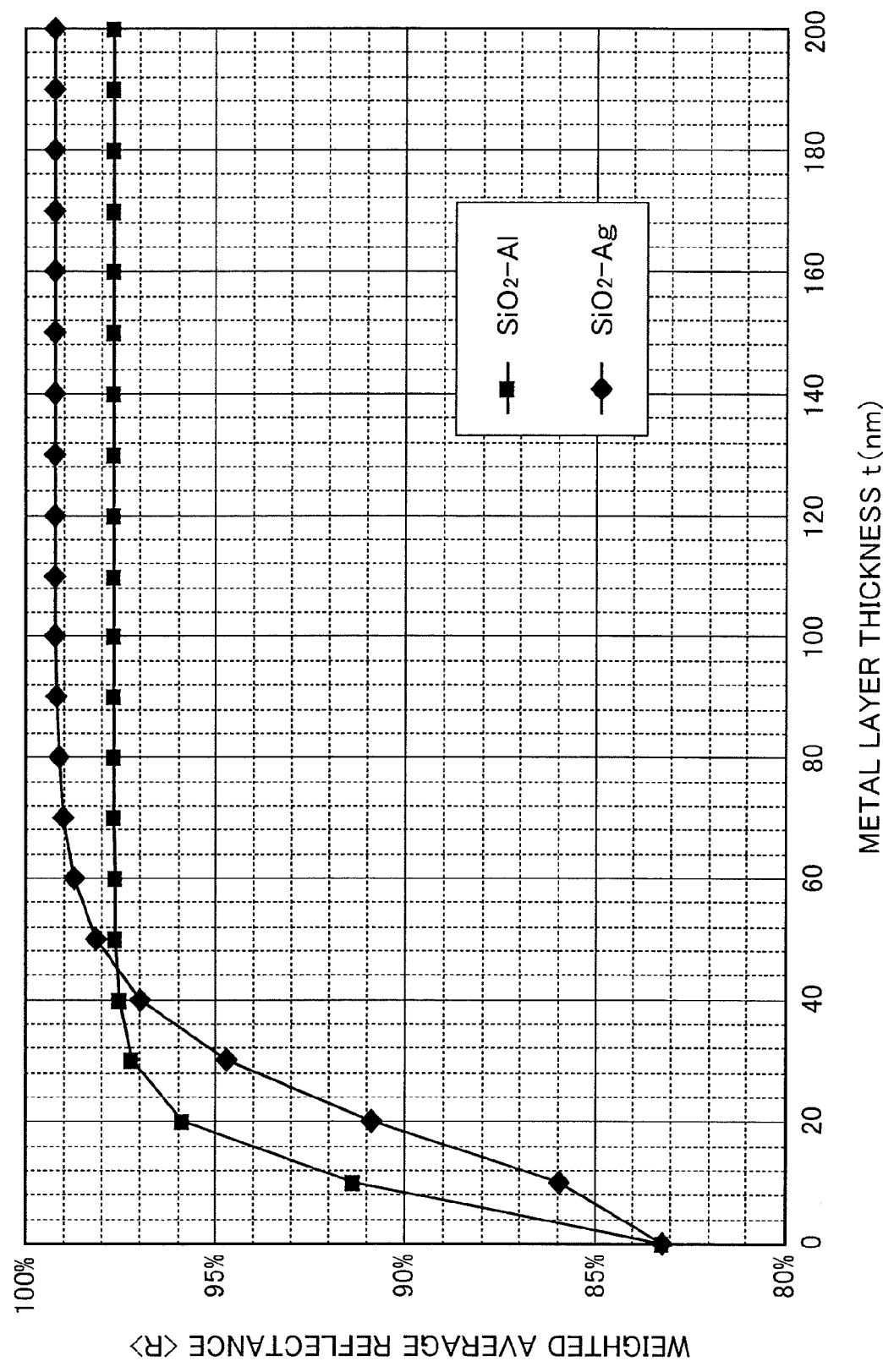
FIG. 15 is a graph depicting the relationship of the thickness t of the metal layer and the weighted average reflectance <R> of the reflection film.
Figure 16A:
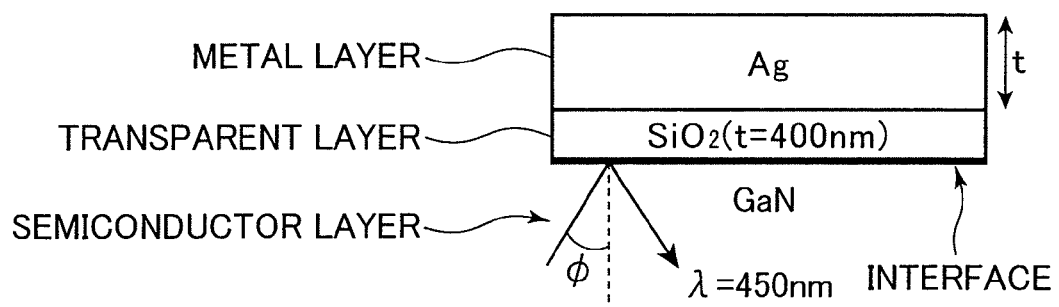
FIG. 16 are diagrams depicting the calculation conditions for the graph shown in FIG. 15.
Figure 16B:
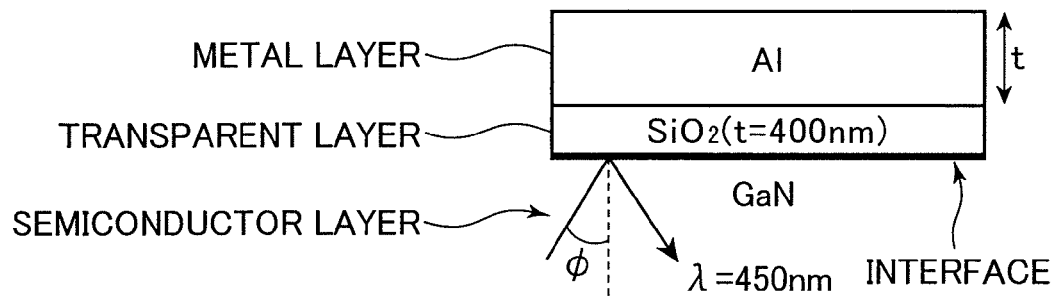

FIG. 15 is a graph depicting the relationship of the thickness t of the metal layer 16, 26, 36 or 46 (Ag or Al) and the weighted average reflectance <R> of the reflection film A, B, C or D. FIG. 16A and FIG. 16B are diagrams depicting the conditions to calculate the weighted average reflectance <R> in FIG. 15.

According to FIG. 15, if Ag is used for the metal layer, the graph becomes approximately flat when the thickness t of the metal layer is 80 nm or more, and the weighted average reflectance <R> does not increase even if the thickness t is increased more. If Al is used for the metal layer, the graph becomes approximately flat when the thickness t of the metal layer is 50 nm or more, and the weighted average reflectance <R> does not increase even if the thickness t is increased more.

Therefore if Ag is used for the metal layer, the thickness t of the metal layer is preferably 80 nm or more, but about 80 nm is more preferable, since a reflectance close to the maximum can be obtained with a minimum thickness.

If Al is used for the metal layer, the thickness t of the metal layer is preferably 50 nm or more, but about 50 nm is more preferable, since a reflectance close to the maximum can be obtained with the minimum thickness.

The metal layer 16, 26, 36 or 46 may be constructed as a multilayer structure in which a plurality of layers are laminated. Each layer laminated in this way may be made of a material selected from the above mentioned materials, or layers made of different materials may be laminated.

If the metal layer 16, 26, 36 or 46 is constituted by Ag or an Ag alloy, degree of adhesion with the transparent layer 15, 25, 35 or 45 ($SiO_2$) is low, and therefore the metal layer 16, 26, 36 or 46 and the transparent layer 15, 25, 35 or 45 may easily separate. Degree of adhesion of Al and an Al alloy to the transparent layer 15, 25, 35 or 45 is higher than that of Ag and an Ag alloy. Therefore if an Al or Al alloy layer is formed and an Ag or Ag alloy layer is formed thereon, so that the Al or the Al alloy layer is inserted between the transparent layer 15, 25, 35 or 45 ($SiO_2$) and the Ag or Ag alloy layer, then the metal layer 16, 26, 36 or 46 and the transparent layer 15, 25, 35 or 45 do not easily separate.

Figure 17:
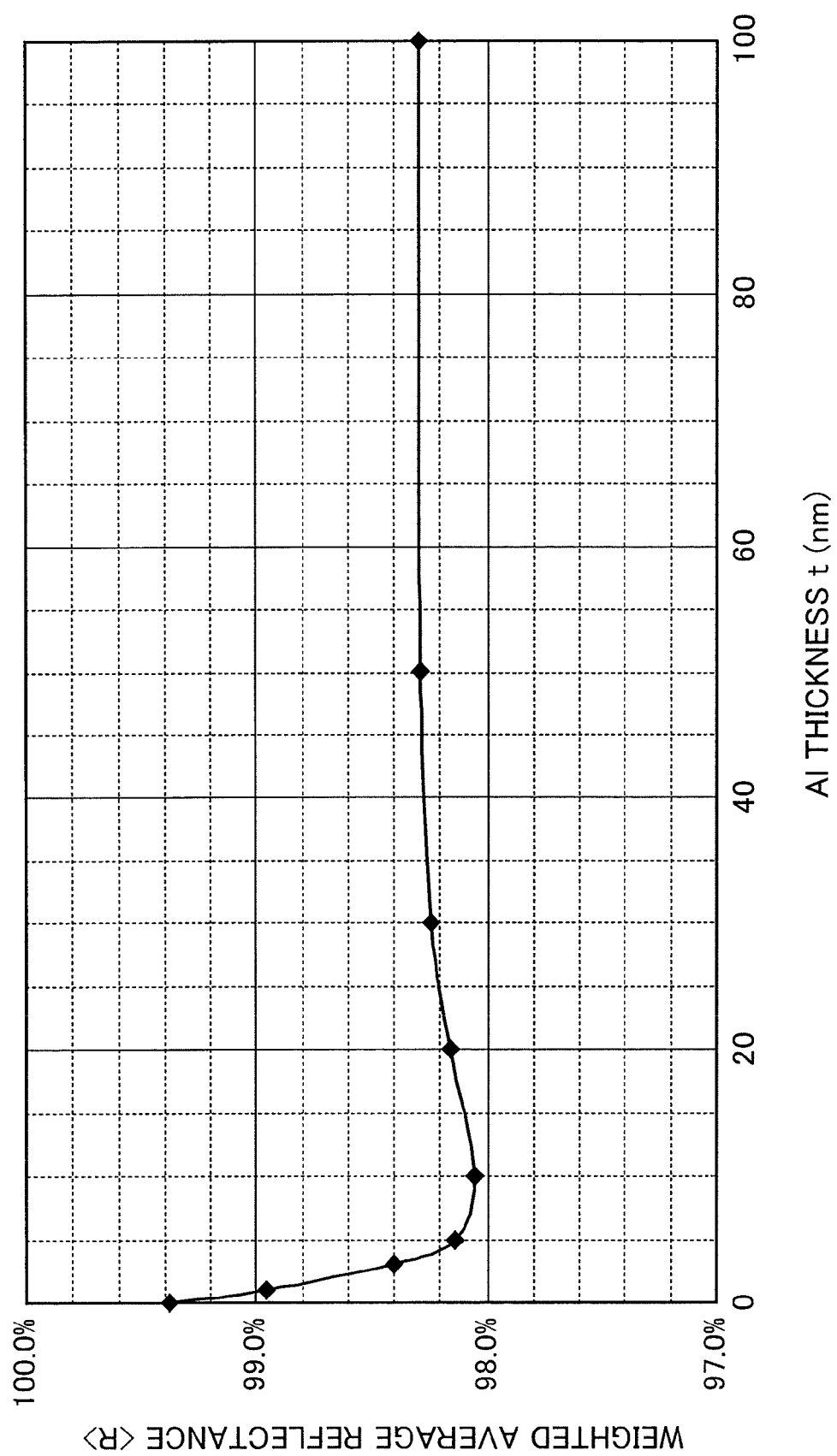
FIG. 17 is a graph depicting the relationship of the thickness t of the Al layer when the metal layer is constructed by forming the Al layer between the Ag layer and the transparent layer, and the weighted average reflectance <R> of the reflection film.
Figure 18:
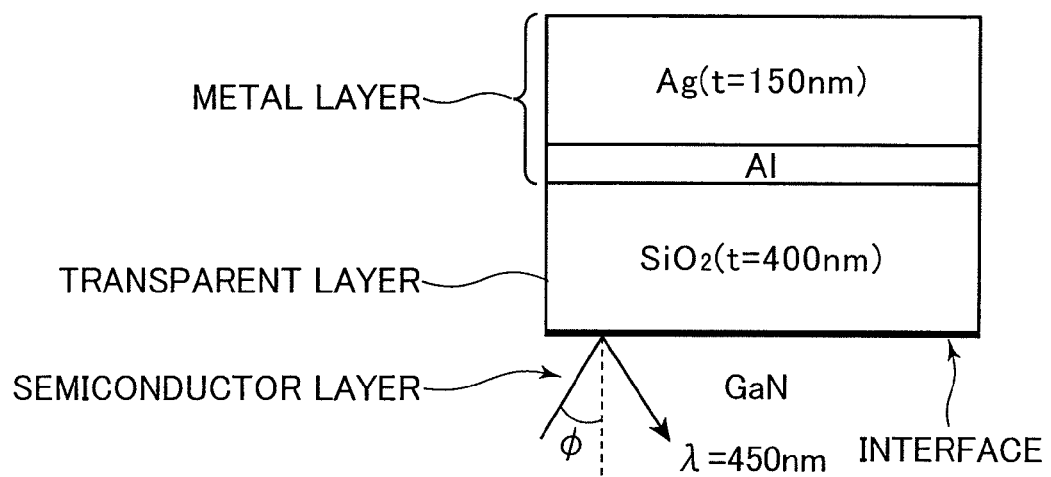
FIG. 18 is a diagram depicting the calculation conditions for the graph shown in FIG. 17.

FIG. 17 is a graph depicting the relationship of the thickness t of the Al layer in the case of forming the metal layer by inserting the Al layer between the Ag layer and the transparent layer, and the weighted average reflectance <R> of the reflection film A, B, C or D. FIG. 18 is a diagram depicting the conditions to calculate the weighted average reflectance <R> in FIG. 17.

According to FIG. 17, when the thickness t of the Al layer is 1 nm, the weighted average reflectance <R> is 99.0%, that is, an extremely good weighted average reflectance <R> is obtained. Therefore it is preferable that the thickness t of the Al layer is 1 nm or less. If the thickness t of the Al layer is 3 nm, the weighted average reflectance <R> is 98.3%, which is equivalent to the reflectance of aluminum in the bulk. Since the light reflectance of Al is lower than Ag, if the thickness t of the Al layer becomes 3 nm or more, the reflectance becomes the same as the case of constructing the metal layer only with an Al layer, without using the Ag layer. Hence the thickness t of the Al layer must be thinner than 3 nm.

In the light emitting diodes 3 and 4 in FIG. 3 and FIG. 4, the transparent layer 35 or 45 and the metal layer 36 or 46 are formed on the growth substrate 30 or 40, which is a portion not related to the path of the diode current, but in the light emitting diodes 1 and 2 in FIG. 1 and FIG. 2, the metal layer 16 or 26 becomes the p-type electrode, and the transparent layer 15 or 25 is formed on the p-type semiconductor layer 13 or 23, that is, formed on the path of the diode current. If the reflection film A or B is formed on the p-type semiconductor layer 13 or 23 and plays the role of the p-type electrode as well, as in this case, the transparent conductive layer 19 or 29 is laminated between the p-type semiconductor layer 13 or 23 and the transparent layer 15 or 25, as shown in FIG. 1 and FIG. 2.

The transparent conductive layer 19 or 29 has conductivity (has ohmic contact) with the p-type semiconductor layer 13 or 23, and is a first electrode layer which is transparent with the emission wavelength of the light emitting layer 12 or 22. The transparent layer 15 or 25 having openings (via holes) 15a or 25a is formed on the transparent conductive layer 19 or 29. If the metal layer 16 or 26 is laminated on the transparent layer 15 or 25, the metal material of the metal layer 16 or 26 is laminated on the transparent layer 15 or 25 via the openings 15a or 25a, and the metal portions 15b or 25b is formed by the metal material laminated inside the openings 15a or 25a.

By these metal portions 15b or 25b, the transparent conductive layer 19 or 29 and the metal layer 16 or 26 are electrically conducted. Thereby the metal layer 16 or 26 is electrically conducted with the p-type semiconductor layer 13 or 23 via the metal portions 15b or 25b and the transparent conductive layer 19 or 29, and is used as the p-type electrode (second electrode layer).

If the Pt layer of which thickness 0.1 nm to 0.3 nm is formed between the transparent conductive layer 19 or 29 (e.g. ITO) and the metal portions 15b or 25b (e.g. Ag), degree of adhesion between the transparent conductive layer 19 or 29 (e.g. ITO) and the metal portions 15b or 25b (e.g. Ag), can be further improved.

In this way, when the reflection film plays a role of the electrode and ohmic contact is required, the openings 15a or 25a are formed by forming micro contact holes in the transparent layer 15 or 25 which utilizes the total reflection effect, or by dividing the area of the transparent layer 15 or 25 to be a mesh, and these openings 15a or 25a are covered with the metal layer 16 or 26 having a high reflectance, whereby the metal portions 15b or 25b are formed. As a result, ohmic contact between the metal layer 16 or 26 and the transparent conductive layer 19 or 29 becomes possible. Because of this configuration, the semiconductor layer 13 or 23 and the metal layer 16 or 26 having high reflectance can be electrically connected without sacrificing an increase of the reflectance by the transparent layer 15 or 25, and sufficient current can be injected into the light emitting layer 12 or 22.

Figure 19A:
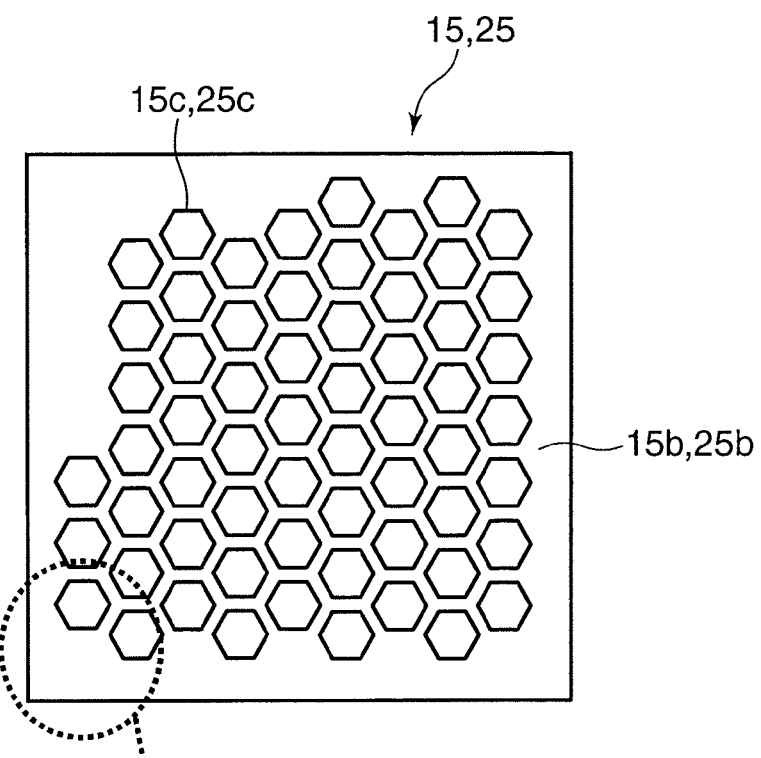
FIG. 19A shows the general view.
Figure 19B:
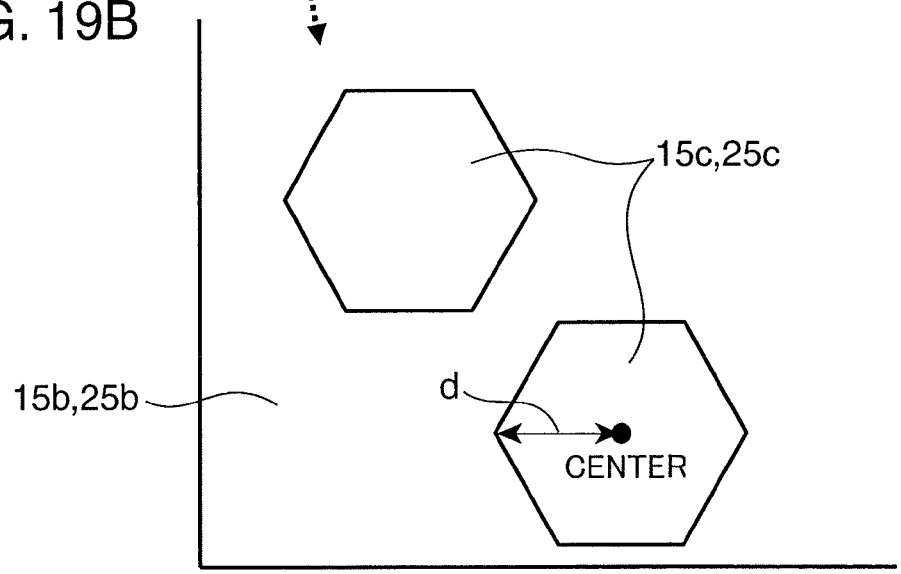
FIG. 19B shows an enlarged view of a part of the transparent layer.
Figure 20A:
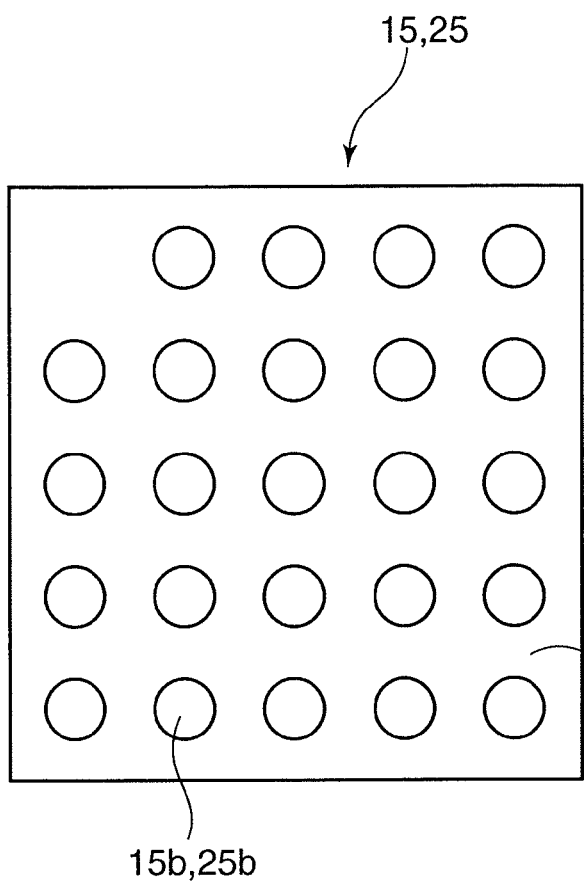
FIG. 20A shows a general view.
Figure 20B:
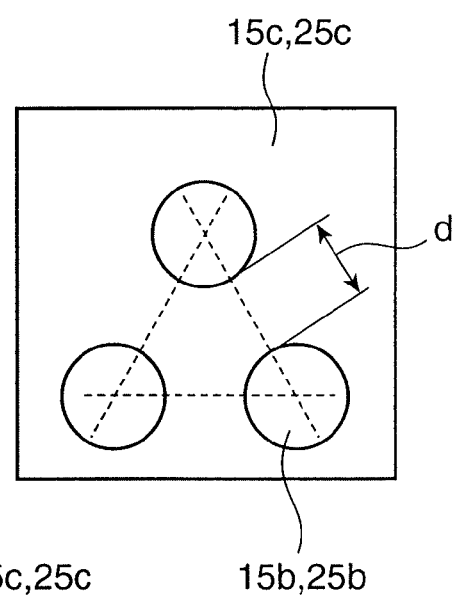
FIG. 20B shows an enlarged view of a part of the transparent layer.

FIG. 19 and FIG. 20 are plan views depicting examples of the transparent layer 15 or 25 shown in FIG. 1 or FIG. 2. FIG. 19A and FIG. 20A show general views respectively, and FIG. 19B and FIG. 20B show enlarged views of a part of the transparent layer respectively.

In the transparent layer 15 or 25 shown in FIG. 19A, a plurality of transparent portions 15c or 25c, having a hexagonal island shape, for example, are disposed. The metal portions 15b or 25b are formed in a mesh so as to fill the spaces between each transparent portion 15c or 25c. The shape of the transparent portion 15c or 25c is not limited to a hexagon, but may be a circle, for example, or other shapes.

In the transparent layer 15 or 25 shown in FIG. 20A, a plurality of metal portions 15b or 25b having a circular island shape, for example, are disposed. The transparent portions 15c or 25c are formed in a mesh so as to fill the spaces between each metal portion 15b or 25b. The shape of the transparent portion 15c or 25c is not limited to a hexagon, but may be a circle, for example, or other shapes.

In the transparent layer 15 or 25, current does not flow through the transparent portions 15c or 25c. Therefore the current for having an LED emit reaches the transparent conductive layer 19 or 29 from the metal layer 16 or 26, which is a p-type electrode, via each metal portion 15b or 25b, then flows from the transparent conductive layer 19 or 29 to the p-type semiconductive layer 13 or 23, light emitting layer 12 or 22, and n-type semiconductor layer 11, and the light emitting layer 12 or 22 emits light.

In order for the light emitting layer 12 or 22 to uniformly emits lights at this time, the current which reached the transparent conductive layer 19 or 29 must flow under the transparent portions 15c or 25c (space between the transparent portions 15c or 25c and the p-type semiconductor layer 13 or 23). As the size of the transparent portion 15c or 25c is smaller, the current can more easily flow under the transparent portions 15c or 25c.

Therefore as the size of the transparent portion 15c or 25c is smaller, the light emitting layer 12 or 22 can emit with more uniform. The size of the transparent portion 15c or 25c is measured by the distance d from the center of the island-shaped transparent portion 15c or 25c to the most distant edge portion, as shown in FIG. 19B, or the shortest distance d between the adjacent metal portions 15b or 25b, as shown in FIG. 20B.

The transparent conductive layer 19 or 29, which is the first electrode layer, is formed by a layer of ITO, which is metal oxide, being deposited to be a 30 nm or less thickness, for example. In this case, a 98% or higher transmittance can be guaranteed, and the total reflection effect in the transparent layer 15 or 25 is not interrupted. A 10 nm or less thickness is especially preferable. Other than ITO, magnesium hydroxide ($Mg(OH)_2$), for example, can be used.

The thickness of the transparent conductive layer 19 or 29, however, need not be 30 nm or less, but may be a thickness exceeding 30 nm.

For the transparent conductive layer 19 or 29, ZnO, GZO which is obtained by doping gallium into ZnO, IZO which is obtained by doping indium into ZnO or doping indium into $In_2O_3$, and AZO which is obtained by doping aluminum into ZnO, for example, may be used instead of ITO and magnesium hydroxide. The transparent conductive layer 19 or 29 may be constructed as a multilayer structure, in which a plurality of layers are laminated. Each layer laminated in this way may be constituted by a same material selected from the above mentioned materials or, layers constituted by different materials may be laminated.

If sputtering is used for depositing the film of the transparent conductive layer 19 or 29, damage caused to the semiconductor layer, which is a base material, is great, which may increase the contact resistance between the semiconductor layer and an adjacent layer. If EB deposition is used for depositing the film of the transparent conductive layer 19 or 29, damage to the semiconductor layer is less than sputtering, therefore an increase in the resistance value of the semiconductor layer is less than sputtering. On the other hand, if EB deposition is used, the flatness of the film deposition is not as good as sputtering, so bumps are generated on the interface between the transparent conductive layer 19 or 29 and the metal layer 16 or 26, and light reflectance drops.

Therefore if the transparent conductive layer 19 or 29 is constructed by laminating a layer formed by EB deposition (first film deposition method) and a layer formed by sputtering (second film deposition method), then the increase of the resistance value of the semiconductor layer can be decreased while suppressing a drop of resistance. It is especially preferable that the surface contacting the transparent layer 15 or 25 of the transparent conductive layer 19 or 29, is formed by sputtering, in order to suppress a drop of reflectance.

Figure 7:
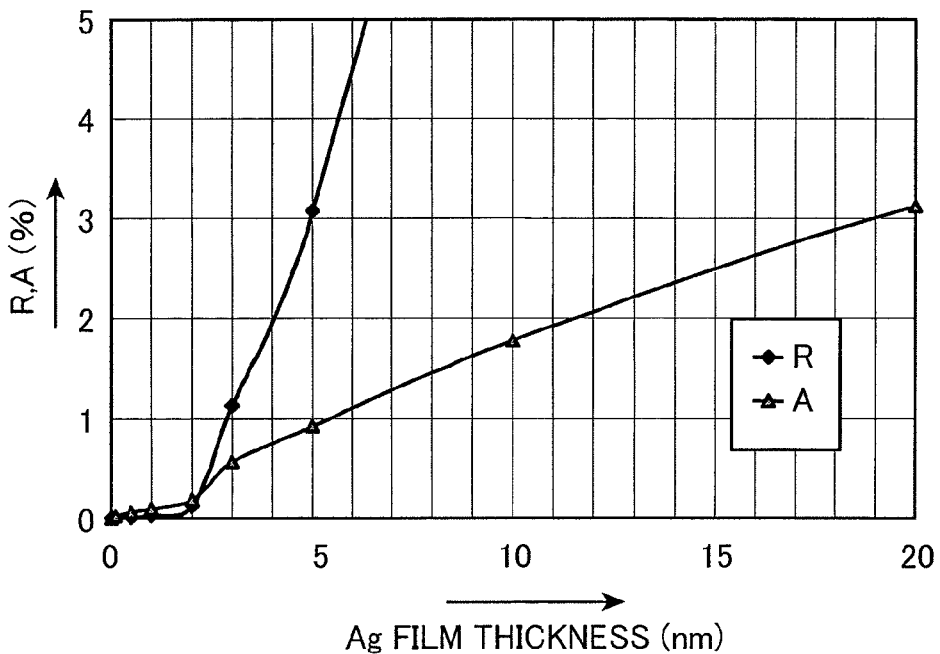
FIG. 7 is a graph enlarging a partial area of FIG. 6.

The transparent conductive layer 19 or 29, which is the first electrode layer, may be constituted by a high reflection metal with low absorption, such as silver, and laminated to be a 5 nm or less thickness. In this case, absorption of the area of which film thickness is 20 nm or less in FIG. 6, which is shown as an enlarged view in FIG. 7, can be 1% or less. In particular, according to FIG. 7, a 2 nm or less thickness is preferable since absorption is extremely low.

The transparent conductive layer 19 or 29, which is the first electrode layer and contacts the p-type semiconductor layer 13 or 23, is constituted by Pt or Rh or an alloy thereof, which can perform ohmic connection with the GaN p-type semiconductor layer 13 or 23, and of which reflectance is 60% or more. By forming openings 19a or 29a in these layers to be mesh or to be divided into island-shaped micro areas, of which thickness is about 2 nm or less and occupying ratio is 50% or less, preferably 25% or less, the forward voltage the light emitting diode 1 or 2 can be decreased without sacrificing the high reflection.

Figure 21:
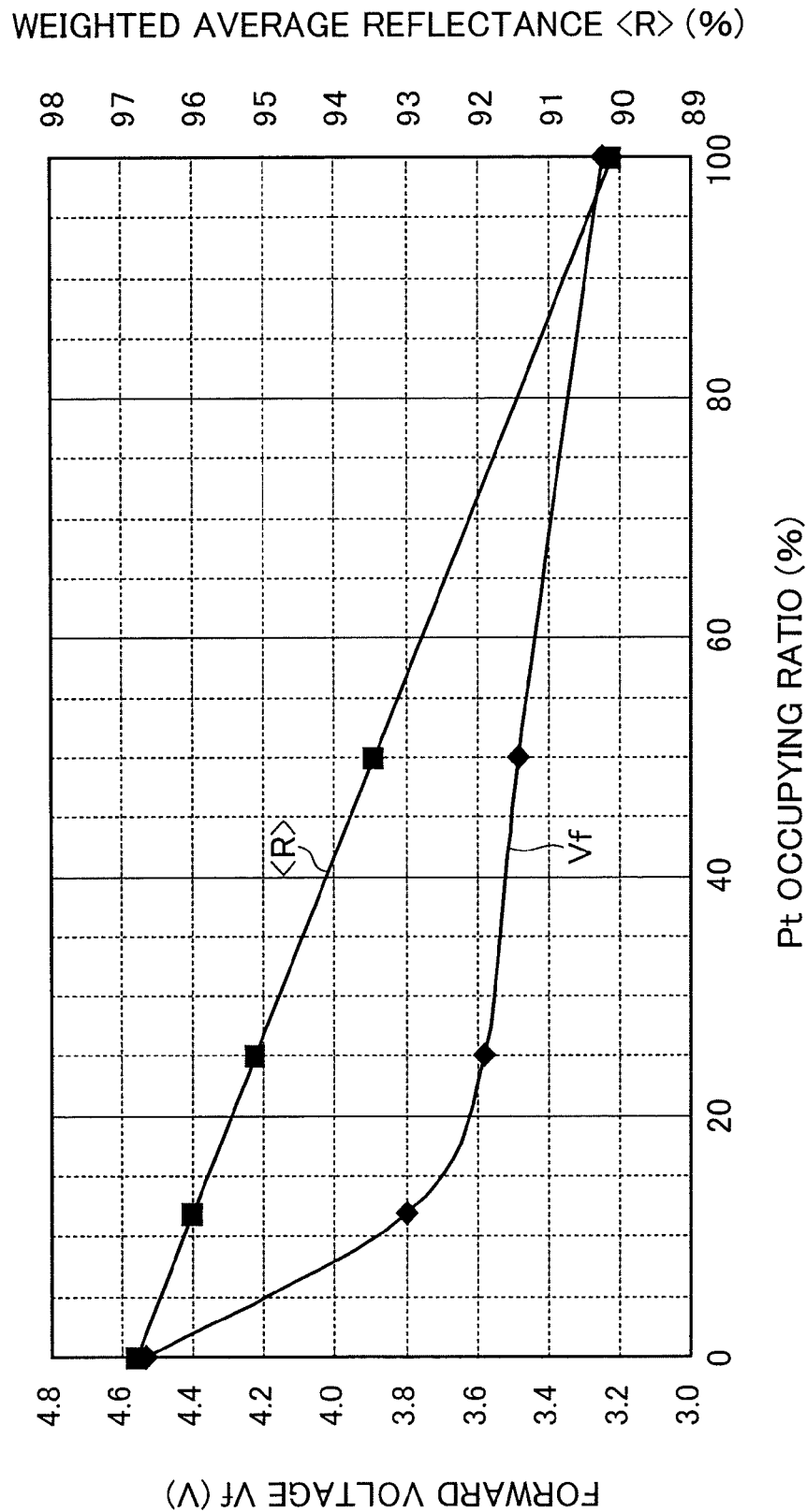
FIG. 21 is a graph depicting the relationship of the area occupying ratio of Pt, when the transparent conductive layer is formed to be mesh or island shapes with a 1 nm thickness using Pt, and forward voltage Vf of the light emitting diode, and the weighted average reflectance <R>.

FIG. 21 is a graph depicting the relationship of the area occupying ratio of Pt when the transparent conductive layer 19 or 29 is formed to be a mesh or island-shaped in a 1 nm thickness using Pt, the forward voltage Vf of the light emitting diode 1 or 2, and the weighted average reflectance <R>.

The emission efficiency of the light emitting diode 1 or 2 is higher as the forward voltage Vf is lower and as the weighted average reflectance <R> is higher.

As FIG. 21 shows, the forward voltage Vf suddenly increases if the area occupying ratio of Pt becomes less than 10%, so it is preferable that the area occupying ratio of Pt is 10% or more. If the area occupying ratio of Pt exceeds 50%, the weighted average reflectance <R> becomes 93% or less, which is not desirable. Therefore it is preferable that the area occupying ratio of Pt is 50% or less. It is more preferable that the area occupying ratio of Pt is 25% or less, since the weighted average reflectance <R> becomes 95% or more in this case.

FIG. 22 is a table showing the experiment result of examining the relationship of the thickness of the Pt layer and degree of adhesion (tensile strength). Sample 1, shown in FIG. 22, is the case of contacting the GaN layer and the Ag layer without having the Pt layer, and Sample 2 to Sample 4 are the case of having the Pt layer between the GaN layer and the Ag layer.

In Sample 1, separation of the layers occurred at a 10 $N/mm^2$ tensile strength. In Sample 2 of which thickness of the Pt layer is 0.1 nm, separation did not occur even at 44.0 $N/mm^2$ tensile strength. In Samples 3 and 4, of which thickness of the Pt layer is 0.3 nm and 1.0 nm respectively, separation did not occur even at 44.7 $N/mm^2$ or more (measurement limit or more) tensile strength.

According to this result, it is preferable that the thickness of the Pt layer is 0.1 nm or more. It is presumed that the similar result as the case of the Rt layer is obtained even if Rh, or an alloy of Pt, or an alloy of Rh, is used, and it is preferable that the thickness of the layer is 0.1 nm or more.

By using the above described light emitting diodes 1 to 4 for an illuminating apparatus, light extraction efficiency can be improved, and as a consequence, an illuminating apparatus that can decrease power consumption and increase brightness can be implemented.

In other words, a semiconductor light emitting element according to an aspect of the present invention includes: an n-type semiconductor layer having optical transparency with an emission wavelength of a light emitting layer; the light emitting layer; and a p-type semiconductor layer, which are laminated; and a reflection film which is disposed on a side opposite to a surface from which light emitted from the light emitting layer is extracted, wherein the reflection film comprises a transparent layer having optical transparency with the emission wavelength of the light emitting layer; and a metal layer, which is laminated on the transparent layer on a side opposite to the light emitting layer and is constituted by a metal material having a high reflectance, and the transparent layer has a refractive index lower than the refractive index of a layer disposed on a side of the light emitting layer when viewed from the transparent layer, with an emission wavelength, and a thickness of the transparent layer is equal to or more than a value obtained by dividing a value of ¾ of the emission wavelength by the refractive index of the transparent layer.

According to this configuration, in a semiconductor light emitting element in which at least an n-type semiconductor layer, a light emitting layer and a p-type semiconductor layer are laminated in this order, or in a reverse order on a substrate which has optical transparency with the emission wavelength of the light emitting layer, and has a conductive buffer layer on a conductive substrate or insulating substrate, so as to be conductive, or on a growth substrate such as an insulating substrate which is separated after the semiconductor layer is grown, a reflection film is disposed on the side opposite to the surface from which light, emitted from the light emitting layer, is extracted. The reflection film is comprised of a transparent layer that has a refractive index lower than the refractive index of the layer disposed at the light emitting layer side with the emission wavelength of the light emitting layer, and has a thickness of a value obtained by dividing a value of ¾ of the emission wavelength by the refractive index of the transparent layer or more, and a metal layer which is laminated on the transparent layer, and is constituted by a metal material having a high reflectance.

Therefore the light which entered at a relatively small angle (small incident angle) less than the critical angle θc is reflected by the transparent layer or the metal layer. The light which entered at a relatively large angle (large incident angle) exceeding the critical angle θc becomes the effusing light, called the "near field wave" or the "evanescent wave", which effuses from the interface between the growth substrate constituted by GaN having high refractive index, or the semiconductor layer, and the reflection film to the transparent layer at the interface. However if the transparent layer has a thickness obtained by dividing a value of ¾ of the emission wavelength by the refractive index of the transparent layer, the possibility of the light passing through the transparent layer and being absorbed by the metal layer decreases, and most of the lights return from the transparent layer to the interface (reflected), and reenter the growth substrate or the semiconductor layer via the interface, and propagate toward the light extraction surface.

Therefore lights which entered the reflection film at all kinds of incident angles can be extracted efficiently, and less power consumption is needed to extract the same amount of light, and brightness can be increased with supplying the same amount of power.

It is preferable that the thickness of the transparent layer is equal to or less than a value obtained by dividing a value of 5/4 of the emission wavelength by the refractive index of the transparent layer.

According to this configuration, the total reflection effect can be obtained if the thickness of the transparent layer is a ¾ optical wavelength or more, as mentioned above. However the actual deposited film has film stress which depends on the film deposition method, and as the transparent layer becomes thicker, the film stress increases and the possibility of the film separating during processing or during use of the device increases.

Therefore by limiting the thickness of the transparent layer to a value obtained by dividing a value of 5/4 of the emission wavelength by the refractive index of the transparent layer or less, both the optical characteristic and the film stability can be compatible.

It is preferable that the layer disposed on the side of the light emitting layer when viewed from the transparent layer is either the n-type semiconductor layer or the p-type semiconductor layer.

According to this configuration, the refractive index of the transparent layer is lower than the refractive indexes of the n-type semiconductor layer and the p-type semiconductor layer disposed on the light emitting layer side of the transparent layer, so lights are reflected on the light emitting layer side of the transparent layer because of this difference of the refractive indexes.

It is preferable that a first electrode layer, which has conductivity with the layer disposed on the side of the light emitting layer when viewed from the transparent layer, out of the n-type semiconductor layer and the p-type semiconductor layer, and is transparent with the emission wavelength, is laminated between the layer disposed on the side of the light emitting layer when viewed from the transparent layer and the transparent layer, and the layer disposed on the side of the light emitting layer when viewed from the transparent layer is either the n-type semiconductor layer or the p-type semiconductor layer, metal portions, which penetrate the transparent layer and electrically conduct the first electrode layer and the metal layer, are disposed in a part of the transparent layer, and the metal layer is used as a second electrode layer.

According to this configuration, the first electrode layer and the metal layer are electrically conducted by the metal portions, which are disposed in a part of the transparent layer, so as to penetrate the transparent layer, so the layer disposed on the light emitting layer side of the transparent layer, out of the n-type semiconductor layer and the p-type semiconductor layer, and the metal layer having high reflectance, that is used as the second electrode layer, are electrically connected via the first electrode layer and the metal portions. Because of this, sufficient current can be injected into the light emitting layer from the second electrode layer, therefore the light emitting layer can emit light while increasing reflectance by the transparent layer, and as a result, light emitting efficiency can be improved.

It is preferable that the metal portions are formed to be a plurality of islands.

According to this configuration in which the metal portions are formed to be a plurality of islands, the current which is supplied from the metal portion to the first electrode layer can more easily flow into the transparent insulating material portion of the transparent layer in the first electrode layer, and as a result, the current supplied to the light emitting layer is equalized, and emission unevenness is decreased.

It is also preferable that the metal portions are formed to be a mesh.

According to this configuration, the metal portions are formed to be a mesh, so the current which is supplied from the metal portions to the first electrode layer can more easily flow into the transparent insulating material portion of the transparent layer in the first electrode layer, and as a result, the current supplied to the light emitting layer is equalized, and emission unevenness is decreased.

It is preferable that the first electrode layer is constituted by at least one of the materials of ITO, GZO, ZnO, IZO and AZO.

ITO, GZO, ZnO, IZO and AZO, which are transparent conductive materials, are appropriate for the first electrode layer.

It is preferable that the first electrode layer is constituted by laminating a layer formed by a first film deposition method and a layer formed by a second film deposition method, which is different from the first film deposition method.

The characteristics of the first electrode layer is different depending on the type of the film deposition method used for depositing the film. Therefore if layers formed by different types of film deposition methods are laminated, combining the characteristics of the respective film deposition methods, it becomes easier to form the first electrode layer having desired characteristics.

It is preferable that the first film deposition method is EB deposition, the second film deposition method is sputtering, and the layer contacting with the transparent layer in the first electrode layer is formed by the sputtering.

Compared with sputtering, EP deposition causes less damage to the semiconductor layer, which is the base material, and an increase of contact resistance between the semiconductor layer and the adjacent layer can be prevented even more. Compared with EB deposition, sputtering excels in generating flatness, so if the layer of the first electrode layer that contacts the transparent layer is formed by sputtering, then the interface of the transparent layer and the first electrode layer becomes flatter, and reflectance increases even more than the case of using EB deposition. Therefore if the first electrode layer is formed such that the layer formed by EB deposition and the layer formed by sputtering are laminated, and the layer formed by sputtering contacts the transparent layer, then the reflectance of the light can be increased while preventing an increase of resistance value of the semiconductor layer.

It is preferable that the first electrode layer is constituted by a high reflection metal with low absorption, and has a thickness of 0.1 nm to 5 nm.

According to this configuration, the first electrode layer is constituted by the high reflectance metal with low absorption, of which thickness is 0.1 nm to 5 nm, then the absorption can be 1% or less.

It is preferable that the high reflectance metal is silver, and the thickness of the first electrode layer is 0.1 nm to 2 nm.

According to this configuration, absorption is very low, which is particularly preferable.

It is preferable that the layer disposed on the side of the light emitting layer when viewed from the transparent layer is the p-type semiconductor layer, and the first electrode layer is formed such that Pt, Rh and an alloy thereof is laminated to be a 0.1 nm to 2 nm thickness, and to be a mesh or micro area group, of which area occupying ratio is 10% to 50%.

According to this configuration, the first electrode layer constituted by Pt, Rh or an alloy thereof can perform ohmic connection with a GaN p-type semiconductor layer, and has a reflectance of 60% or more. By forming this first electrode layer to be a 0.1 nm to 2 nm thickness, and to have a mesh or micro area group of which area occupying ration is 10% to 50%, the forward voltage can be decreased without sacrificing high reflection.

It is preferable that the n-type semiconductor layer, the light emitting layer and the p-type semiconductor layer are laminated on a growth substrate having optical transparency, the reflection film is disposed on a surface opposite to the light emitting layer on the growth substrate, and the layer disposed on the side of the light emitting layer when viewed from the transparent layer is the growth substrate.

By this configuration, a structure in which the light irradiated from the light emitting layer is extracted to the opposite side of the growth substrate can be implemented.

It is preferable that the transparent layer is constituted by at least one of the materials of $SiO_2$, $ZrO_2$, $Al_2O_3$, $TiO_2$, $Ta_2O_5$, MgF, CaF and $Si_3N_4$.

According to this configuration, $SiO_2$ (refractive index=1.43) is appropriate for the transparent layer for implementing the total reflection effect. It is preferable that the semiconductor layer is constituted by the III-V group, and it is particularly preferable if the semiconductor layer is constituted by a ZnO material in the II-VI group, since the refractive index of ZnO is 2.0, which is appropriate to implement the total reflection effect. As well as $SiO_2$, such materials as $ZrO_2$, $Al_2O_3$, $TiO_2$, $Ta_2O_5$, MgF, CaF and $Si_3N_4$ are also appropriate as the transparent layer.

It is preferable that the metal layer is constituted by at least one of the materials of silver, Al and an alloy thereof.

Since silver, Al and an alloy thereof have high light reflectance, these materials are appropriate for the metal layer.

It is preferable that either Al or an Al alloy layer and a silver layer are laminated so that the either Al or Al alloy layer contacts the transparent layer.

The Al or Al alloy has higher degree of adhesion to the transparent layer than silver, so if the metal layer is constituted by laminating either Al or the Al alloy layer and the silver layer, so that this Al or Al alloy layer contacts the transparent layer, separation between the metal layer and the transparent layer can be prevented even more.

It is preferable that the metal layer is silver, and a thickness of the metal layer is 80 nm or more.

According to this configuration, a 98% to 99% or more reflectance can be obtained by laminating the transparent layer and silver layer, and high light extraction efficiency can be implemented. If the reflectance index (n, k) of silver is (0.66, 2.5), then reflectance (R) is 93% or more, and transmittance (T) is 3% or less in the case of an 80 nm film thickness, although this changes somewhat depending on the film deposition method and film deposition conditions, therefore the film thickness is preferably 80 nm or more to obtain high reflectance. Here k of refractive index denotes the "absorption coefficient" or "attenuation coefficient". However as the film thickness increases, separation tends to occur more due to film stress, so about a 100 nm film thickness is especially preferable.

It is preferable that the metal layer is Al, and the thickness of the metal layer is 50 nm or more.

According to this configuration, a 97% or higher reflectance is obtained by laminating the transparent layer and Al layer, and high light extraction efficiency can be implemented.

It is preferable that a Pt layer is formed between the first electrode layer and the metal portions.

According to this configuration, degree of adhesion between the first electrode layer and the metal portions can be further increased.

An illuminating apparatus according to the present invention uses the above mentioned semiconductor light emitting element.

According to this configuration, the light extraction efficiency can be improved, and as a consequence an illuminating apparatus that can decrease power consumption and increase brightness can be implemented.

The invention claimed is:

1. A semiconductor light emitting element, comprising:
    a light emitting layer for emitting light having an emission wavelength, the light emitting layer having a first surface and a second surface opposite to the first surface;
    a first semiconductor layer placed on the first surface of the light emitting layer, the first semiconductor layer being made of one of an n-type semiconductor and a p-type semiconductor, the first semiconductor layer having optical transparency for the emission wavelength;
    a second semiconductor layer placed on the second surface of the light emitting layer, the second semiconductor layer being made of the other of the n-type semiconductor and the p-type semiconductor, the second semiconductor layer having optical transparency for the emission wavelength;
    a first electrode layer placed on a surface of the first semiconductor layer that is opposite to the light emitting layer, the first electrode layer being conductively coupled with the first semiconductor layer and having optical transparency for the emission wavelength of the light emitting layer; and
    a transparent layer placed on the first electrode layer and having optical transparency for the emission wavelength of the light emitting layer;
    a metal layer having a contacting surface made to contact with the transparent layer for reflecting the light, the metal layer operable to be electrode; and
    an electric connector extending from the contacting surface of the metal layer through the transparent layer for electrically connecting the metal layer with the first electrode layer.

2. The semiconductor light emitting element according to claim 1, wherein
    the transparent layer has a refractive index lower than a refractive index of the first semiconductor layer,
    a thickness of the transparent layer is equal to or more than a value obtained by dividing a value of ¾ of the emission wavelength by the refractive index of the transparent layer, and
    the thickness of the transparent layer is equal to or less than a value obtained by dividing a value of 5/4 of the emission wavelength by the refractive index of the transparent layer.

3. The semiconductor light emitting element according to claim 1, wherein the electric connector includes a plurality of metal portions in the form of a plurality of separate islands passing through the transparent layer.

4. The semiconductor light emitting element according to claim 1, wherein the electric connector includes a metal portion in the form of a mesh.

5. The semiconductor light emitting element according to claim 1, wherein
    the first electrode layer is made of at least one of ITO, GZO, ZnO, IZO and AZO.

6. The semiconductor light emitting element according to claim 5, wherein
    the first electrode layer includes a lamination of a first layer formed by a first film deposition method and a second layer formed by a second film deposition method which is different from the first film deposition method, the second layer contacting with the transparent layer.

7. The semiconductor light emitting element according to claim 6, wherein
    the first film deposition method is EB deposition,
    the second film deposition method is sputtering.

8. The semiconductor light emitting element according to claim 1, wherein
    the first electrode layer is made of a metal having light reflectiveness, and has a thickness of 0.1 nm to 5 nm.

9. The semiconductor light emitting element according to claim 8, wherein
    the metal is silver, and the thickness of the first electrode layer is 0.1 nm to 2 nm.

10. The semiconductor light emitting element according to claim 1, wherein
    the first semiconductor layer is made of the p-type semiconductor, and
    the first electrode layer includes a lamination of one of Pt, Rh, and an alloy thereof, the lamination having a thickness of 0.1 nm to 2 nm, and having the form of a mesh or a micro area group of which area occupying ratio is 10% to 50%.

11. The substrate light emitting element according to claim 1, wherein
    the transparent layer is made of at least one of $SiO_2$, $ZrO_2$, $Al_2O_3$, $TiO_2$, $Ta_2O_5$, MgF, CaF and $Si_3N_4$.

12. The semiconductor light emitting element according to claim 1, wherein
    the metal layer is made of at least one of silver, Al, and an alloy thereof.

13. The semiconductor light emitting element according to claim 12, wherein
    the metal layer includes a lamination of either Al or an Al alloy layer and a silver layer, and
    either Al or the Al alloy layer contacts the transparent layer.

14. The semiconductor light emitting element according to claim 12, wherein
    the metal layer is made of silver, and
    a thickness of the metal layer is 80 nm or more.

15. The semiconductor light emitting element according to claim 12, wherein
    the metal layer is made of Al, and
    the thickness of the metal layer is 50 nm or more.

16. The semiconductor light emitting element according to claim 1, further comprising:
    a Pt layer formed between the first electrode layer and the electric connector.

17. An illuminating apparatus using the semiconductor light emitting element according to claim 1.

* * * * *